United States Patent
Tanaka et al.

(10) Patent No.: US 6,489,952 B1
(45) Date of Patent: Dec. 3, 2002

(54) ACTIVE MATRIX TYPE SEMICONDUCTOR DISPLAY DEVICE

(75) Inventors: Yukio Tanaka, Kanagawa (JP); Shou Nagao, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/438,432

(22) Filed: Nov. 12, 1999

(30) Foreign Application Priority Data

Nov. 17, 1998 (JP) .......................................... 10-326470
Mar. 29, 1999 (JP) .......................................... 11-086202

(51) Int. Cl.$^7$ ................................................ G09G 5/00
(52) U.S. Cl. ............................ 345/205; 345/87; 345/76
(58) Field of Search ........................ 345/36, 45, 76–83, 345/87–103, 204, 205, 206; 315/169.3; 313/463; 348/800

(56) References Cited

U.S. PATENT DOCUMENTS

| | | | | |
|---|---|---|---|---|
| 4,770,501 A | * | 9/1988 | Tamura et al. ................ | 345/92 |
| 4,866,348 A | | 9/1989 | Harada et al. | |
| 5,247,190 A | | 9/1993 | Friend et al. ................. | 257/40 |
| 5,399,502 A | | 3/1995 | Friend et al. .................. | 437/1 |
| 5,448,385 A | * | 9/1995 | Deffontaines et al. ...... | 349/141 |
| 5,594,569 A | | 1/1997 | Konuma et al. ............ | 349/122 |
| 5,643,826 A | | 7/1997 | Ohtani et al. ................. | 437/88 |
| 5,648,277 A | | 7/1997 | Zhang et al. ................. | 437/21 |
| 5,648,793 A | * | 7/1997 | Chen ........................... | 345/96 |
| 5,748,165 A | | 5/1998 | Kubota et al. | |
| 5,923,962 A | | 7/1999 | Ohtani et al. ............... | 438/150 |
| 5,926,161 A | * | 7/1999 | Furuhashi et al. .......... | 345/100 |
| 5,936,598 A | * | 8/1999 | Hayama et al. ............. | 345/76 |
| 5,990,629 A | * | 11/1999 | Yamada et al. .......... | 315/169.3 |
| 6,064,362 A | * | 5/2000 | Brownlow et al. ........... | 345/98 |

FOREIGN PATENT DOCUMENTS

| | | |
|---|---|---|
| EP | 0632426 | 1/1995 |
| JP | 07-130652 | 5/1995 |
| JP | 07-135318 | 5/1995 |
| JP | 08-078329 | 3/1996 |
| JP | 10-092576 | 4/1998 |
| JP | 10-135468 | 5/1998 |
| JP | 10-135469 | 5/1998 |
| JP | 10-247735 | 9/1998 |
| JP | 10-270363 | 10/1998 |
| WO | WO90/13148 | 11/1990 |

OTHER PUBLICATIONS

Hermann Schenk et al., "Polymers for Light Emitting Diodes", EuroDisplay '99 Proceedings, pp. 33–37.
Inui et al., "Thresholdless Antiferroelectricity In Liquid Crystals and its application to Displays", J. mater. Chem., 1996, 6(4), pp 671–673.
Furue et al., "Characteristics and Driving Scheme of polymer–Stabilized Monostable FLCD Exhibiting Fast Response Time and High Contrast Ratio with Gray–Scale Capability", SID 98 Digest, pp. 782–785.
Yoshida et al., "A Full–Color Thresholdless Antiferroelectric LCD Exhibiting Wide Viewing Angle with Fast Response Time", SID 97 Digest, pp 841–844.

* cited by examiner

Primary Examiner—Richard Hjerpe
Assistant Examiner—Alexander Eisen
(74) Attorney, Agent, or Firm—Eric J. Robinson; Robinson Intellectual Property Law Office, P.C.

(57) ABSTRACT

There is provided an active matrix type semiconductor display device which realizes low power consumption and high reliability. In the active matrix type semiconductor display device of the present invention, a counter electrode is divided into two, different potentials are applied to the two counter electrodes, respectively and inversion driving is carried out each other. Since a potential of an image signal can be made low by doing so, it is possible to lower a voltage necessary for operation of a driver circuit. As a result, it is possible to realize improvement of reliability of an element such as a TFT and reduction of consumed electric power. Moreover, since it is possible to lower a voltage of a timing pulse supplied by the driver circuit, a booster circuit can be omitted, and reduction of an area of the driver circuit can be realized.

27 Claims, 28 Drawing Sheets

PHOSPORUS DOPING STEP

BORON DOPING STEP

CRYSTALLIZING STEP

CRYSTALLIZING STEP

ACTIVE MATRIX TYPE SEMICONDUCTOR DISPLAY DEVICE

BACKGROUND OF THE INVENTION

1. Field of the Invention

The present invention relates to an active matrix type semiconductor display device, and particularly to an active matrix type liquid crystal display device.

2. Description of the Related Art

In recent years, as an FPD (Flat Panel Display), an active matrix type semiconductor display device enlivens the market. Above all, an active matrix type liquid crystal display device has been frequently used as a display device of a personal computer. Further, in addition to a use for a note-sized personal computer, the active matrix type liquid crystal display device with a large screen comes to be used for a desktop personal computer.

For the active matrix type liquid crystal display device used for a personal computer, in addition to a request for a large screen, it is required that plural pieces of information can be displayed at the same time. Then, the active matrix type liquid crystal display device which has a large screen, high fineness, and high picture quality, and enables a full color display, has been required.

Among active matrix type liquid crystal display devices, a TN (twisted nematic) liquid crystal display device using a nematic liquid crystal appears most frequently on the market. FIG. 20 is a schematic structural view showing a conventional active matrix type TN liquid crystal display device. In FIG. 20, reference numeral 3001 designates a source signal line driver circuit; 3002, a gate signal line driver circuit; and 3003, an active matrix circuit. The active matrix circuit 3003 is a circuit in which a plurality of pixel TFTs 3004 are arranged in matrix form. A gate signal line and a source signal line are connected to a gate electrode and a source electrode of each of the pixel TFTs 3004, respectively. A pixel electrode is connected to a drain electrode of the pixel TFT. In general, a substrate having a driver circuit and an active matrix circuit is called an active matrix substrate. A liquid crystal 3006 is sandwiched between the active matrix substrate and a counter substrate (not shown) on the entire surface of which a counter electrode is formed.

A selection signal is sequentially supplied to the gate signal line from the gate signal line driver circuit. All pixel TFTs connected to the gate signal line to which the selection signal is supplied are turned ON, and the source signal line driver circuit 3001 sequentially supplies an image signal to the source signal line, so that writing of the image signal to the pixel TFT (that is, the liquid crystal and holding capacitance) is carried out.

In general, in the case where a material having hysteresis with respect to an applied voltage, such as a nematic liquid crystal, is used, an electric field in a reverse direction is applied to the liquid crystal at every predetermined period in order to prevent "burning" of a screen. This driving system is called an inversion driving system. The "hysteresis" with respect to the applied voltage means that the change in electrooptical characteristics of the liquid crystal when the voltage is applied does not coincide with the change in electrooptical characteristics of the liquid crystal when the voltage is removed. The "burning" of the screen means a disturbance of display which occurs due to this hysteresis.

For the purpose of preventing the above "burning" of the screen, a driving system called the inversion driving system is often used. In this inversion driving system, a system in which a direction of an electric field applied to a liquid crystal is inverted at every rewriting of a display screen is called a frame inversion system. This system is a driving system which can be easily carried out among the inversion driving systems. The frame inversion system is conventionally most frequently adopted for an active matrix type liquid crystal display device.

In recent years, while an active matrix type liquid crystal display device having high resolution/high fineness has been required, a problem of the frame inversion system becomes clear. For the purpose of realizing the active matrix type liquid crystal display device having high resolution/high fineness, it is necessary to shorten a period in which an image signal is charged in a liquid crystal and holding capacitance. From the performance of a driver circuit, there is a limit in shortening of this charging period, and a time division driving system has been newly adopted. However, in the case where a liquid crystal is driven by the frame inversion system, when the time division driving system is used, a so-called crosstalk phenomenon may occur, which deteriorates the quality of a display screen through parasitic capacitance which can not be avoided in design.

For the purpose of decreasing this crosstalk phenomenon, a gate line (row) inversion system which is such a system that a direction of an electric field applied to a liquid crystal is inverted for every image signals of one to several rows, or a source line (column) inversion system which is such a system that a direction of an electric field applied to a liquid crystal is inverted for every image signals of one to several columns, begins to be adopted.

The property of low power consumption is required especially for an active matrix type liquid crystal display device of a note-sized personal computer. However, even in the case where any of the foregoing three inversion driving systems is used, it is necessary to prepare a high potential side power source and a low potential side power source, and to prepare an image signal having a potential at a side of the high potential side power source and an image signal having a potential at a side of the low potential side power source. Thus, it becomes necessary to provide a difference between the high potential side power source and the low potential side power source in a driver circuit, which is approximately twice as large as that of the case where the inversion driving system is not used. As a result, such a state is caused that reliability of components such as TFTs making a driver circuit and an active matrix circuit is deteriorated, and consumed electric power of the driver circuit is increased. Besides, in the case where the high potential side power source of higher voltage is used for a part of the driver circuit, it becomes necessary to provide a booster circuit for conversion into a signal of higher voltage required for screen display, and as a result, there occurs a problem that an area of the driver circuit becomes large.

SUMMARY OF THE INVENTION

The present invention has been made in view of the foregoing problems, and an object thereof is to realize an active matrix type semiconductor display device which resolves harmful effects in the case where an inversion driving system is used.

In an active matrix type semiconductor display device of the present invention, a counter electrode is divided into two, different electric potentials are applied to the two counter electrodes, respectively, and inversion driving is carried out each other. Since a voltage of an image signal can be made low by doing so, it is possible to lower a voltage necessary for operation of a driver circuit. As a result, it is possible to realize improvement of reliability of an element such as a TFT constituting the driver circuit and an active matrix circuit, and reduction of consumed electric power. Moreover, since it is possible to lower a voltage of a timing pulse supplied by the driver circuit, a booster circuit can be omitted, and reduction of an area of the driver circuit can be realized.

Accordingly, in the active matrix type semiconductor display device of the present invention, an addressing mode such as gate line (row) inversion driving, source line (column) inversion driving, or dot (point) inversion driving can be effectively adopted, and deterioration of a display screen can be prevented.

A structure of an active matrix type semiconductor display device of the present invention is as follows.

According to the present invention, an active matrix type semiconductor display device comprises: a source signal line driver circuit for supplying an image signal to a plurality of source signal lines; a gate signal line driver circuit for supplying a selection signal to a plurality of gate signal lines; an active matrix circuit in which pixels each including a pixel TFT and a pixel electrode connected to a drain electrode of the pixel TFT are arranged in matrix form, a source electrode of the pixel TFT is connected to the source signal line, and a gate electrode of the pixel TFT is connected to the gate signal line; two counter electrodes; and a display medium sandwiched between the pixel electrode and the counter electrodes; wherein the two counter electrodes are respectively disposed correspondingly to pixels of one source signal line at every two source signal lines among the plurality of source signal lines; and the two counter electrodes are respectively applied with a potential opposite to a potential of an image signal supplied to the corresponding source signal line.

Moreover, according to the present invention, an active matrix type semiconductor display device comprises: a source signal line driver circuit for supplying an image signal to a plurality of source signal lines; a gate signal line driver circuit for supplying a selection signal to a plurality of gate signal lines; an active matrix circuit in which pixels each including a pixel TFT and a pixel electrode connected to a drain electrode of the pixel TFT are arranged in matrix form, a source electrode of the pixel TFT is connected to the source signal line, and a gate electrode of the pixel TFT is connected to the gate signal line; two counter electrodes; and a display medium sandwiched between the pixel electrode and the counter electrodes; wherein the two counter electrodes are respectively disposed correspondingly to pixels of two source signal lines at every four source signal lines among the plurality of source signal lines; and the two counter electrodes are respectively applied with a potential opposite to a potential of an image signal supplied to the corresponding source signal line.

Moreover, according to the present invention, an active matrix type semiconductor display device comprises: a source signal line driver circuit for supplying an image signal to a plurality of source signal lines; a gate signal line driver circuit for supplying a selection signal to a plurality of gate signal lines; an active matrix circuit in which pixels each including a pixel TFT and a pixel electrode connected to a drain electrode of the pixel TFT are arranged in matrix form, a source electrode of the pixel TFT is connected to the source signal line, and a gate electrode of the pixel TFT is connected to the gate signal line; two counter electrodes; and a display medium sandwiched between the pixel electrode and the counter electrodes; wherein the two counter electrodes are respectively disposed correspondingly to pixels of $z$ source signal lines at every $2z$ source signal lines among the plurality of source signal lines; and the two counter electrodes are respectively applied with a potential opposite to a potential of an image signal supplied to the corresponding source signal line.

The display medium may be a liquid crystal.

DETAILED DESCRIPTION OF THE PREFERRED EMBODIMENTS

An active matrix type semiconductor display device of the present invention will be described below with embodiments. However, the following embodiments are merely examples of the active matrix type semiconductor display device of the present invention, and the active matrix type semiconductor display device of the present invention is not limited to these embodiments.

Embodiment 1

In this embodiment, an active matrix type display device of the present invention will be described by use of an active matrix type liquid crystal display device in which a liquid crystal is used as a display medium.

Figure 1:
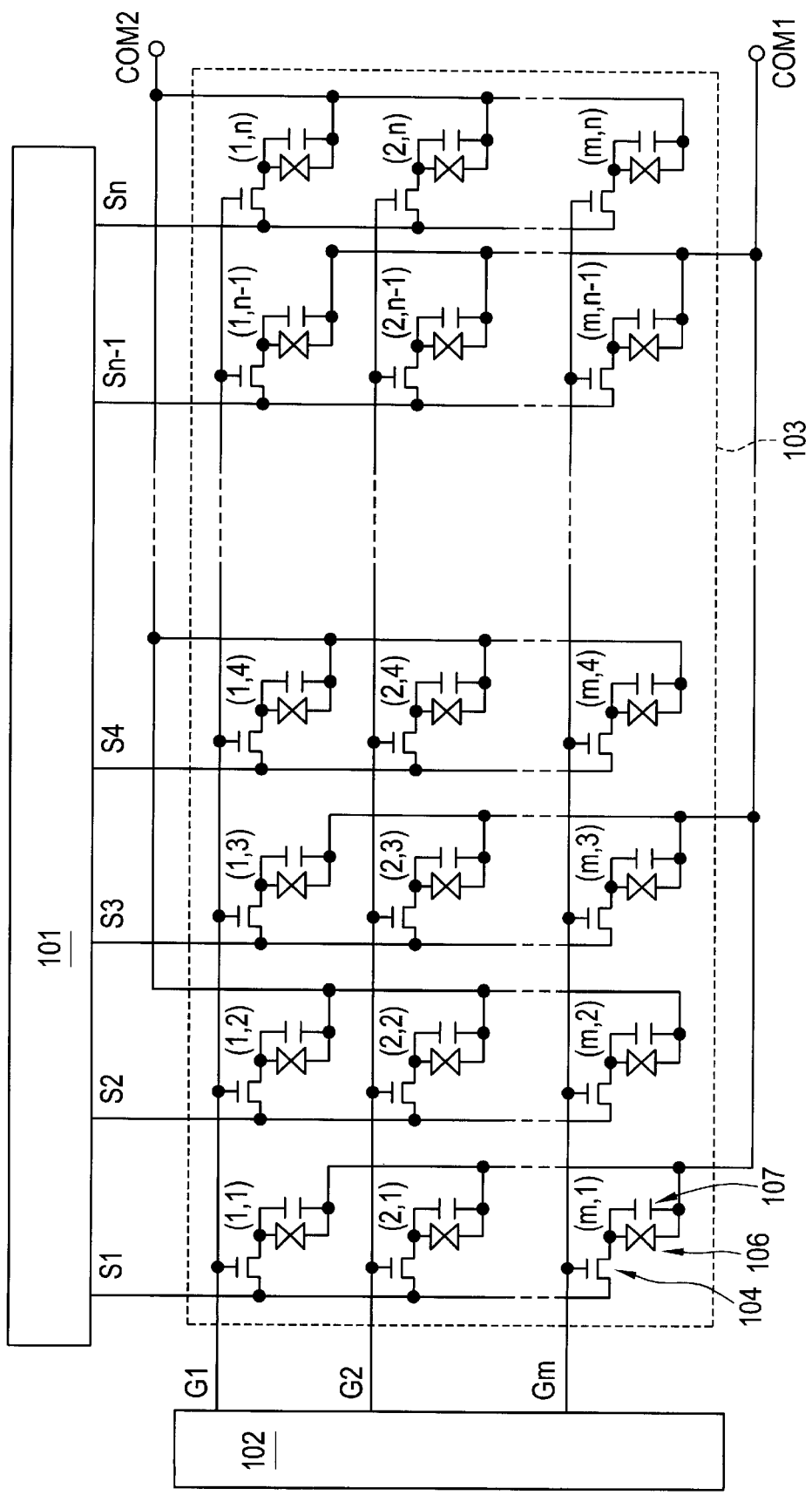
FIG. 1 is a schematic structural view of an embodiment of an active matrix type semiconductor display device of the present invention.

Reference will be made to FIG. 1. FIG. 1 is a schematic structural view showing an active matrix type liquid crystal display device of this embodiment. Reference numeral 101 designates a source signal line driver circuit; 102, a gate signal line driver circuit; and 103, an active matrix circuit.

The active matrix circuit 103 is a portion where display of an image is made, and is constituted by a plurality of pixels. The active matrix type liquid crystal display device of this embodiment includes (m×n) pixels. Both n and m are natural numbers, and in this embodiment, n is an even number (m may be an even number or an odd number). For convenience of explanation, reference characters of (1, 1) to (m, n) are given to the respective pixels.

Each of the pixels (1, 1) to (m, n) includes a pixel TFT 104. For each pixel TFT 104, a reference character given to the pixel is cited for convenience of explanation. That is, the pixel TFT at the pixel (1, 1) is indicated by a pixel TFT (1, 1).

A gate signal line G1 is connected to gate electrodes of the pixel TFT (1, 1), pixel TFT (1, 2), . . . , pixel TFT (1, n). A gate signal line G2 is connected to gate electrodes of the pixel TFT (2, 1), pixel TFT (2, 2), . . . , pixel TFT (2, n). Similarly, a gate signal line Gm is connected to gate electrodes of the pixel TFT (m, 1), pixel TFT (m, 2), . . . , pixel TFT (m, n).

A source signal line S1 is connected to source electrodes of the pixel TFT (1, 1), pixel TFT (2, 1), . . . , pixel TFT (m, 1). A source signal line S2 is connected to source electrodes of the pixel TFT (2, 1), pixel TFT (2, 2), . . . , pixel TFT (m, 2). Similarly, a source signal line Sn is connected to source electrodes of the pixel TFT (1, n), pixel TFT (2, n), . . . , pixel TFT (m, n).

The source signal line driver circuit 101 includes a shift register circuit, a buffer circuit, a sampling circuit, etc., and a clock signal, a start pulse, an image signal, etc. are inputted from the outside. The gate signal line driver circuit 102 includes a shift register circuit, a buffer circuit, etc., and a clock signal, a start pulse, etc. are inputted from the outside. The source signal line driver circuit 101 supplies an image signal to the source signal lines S1 to Sn. The gate signal line driver circuit supplies a selection signal to the gate signal lines G1 to Gm.

A pixel electrode 105 (not shown) is connected to a drain electrode of each of all the pixel TFT (1, 1) to pixel TFT (m, n). A counter electrode 1 (not shown) and a counter electrode 2 (not shown) are formed at the side of a counter substrate (not shown). The counter electrode 1 is connected to a potential COM1. The counter electrode 2 is connected to a potential COM2. The counter electrode 1 and the counter electrode 2 do not have the same potential, but are supplied with potentials different from each other, more precisely, potentials opposite to each other. A liquid crystal 106 is sandwiched between the counter substrate and the active matrix substrate including the driver circuits and the active matrix circuit. Reference numeral 107 designates a holding capacitance connected to the drain electrode of each pixel TFT 104 and the common electrode 1 or common electrode 2.

Figure 2:
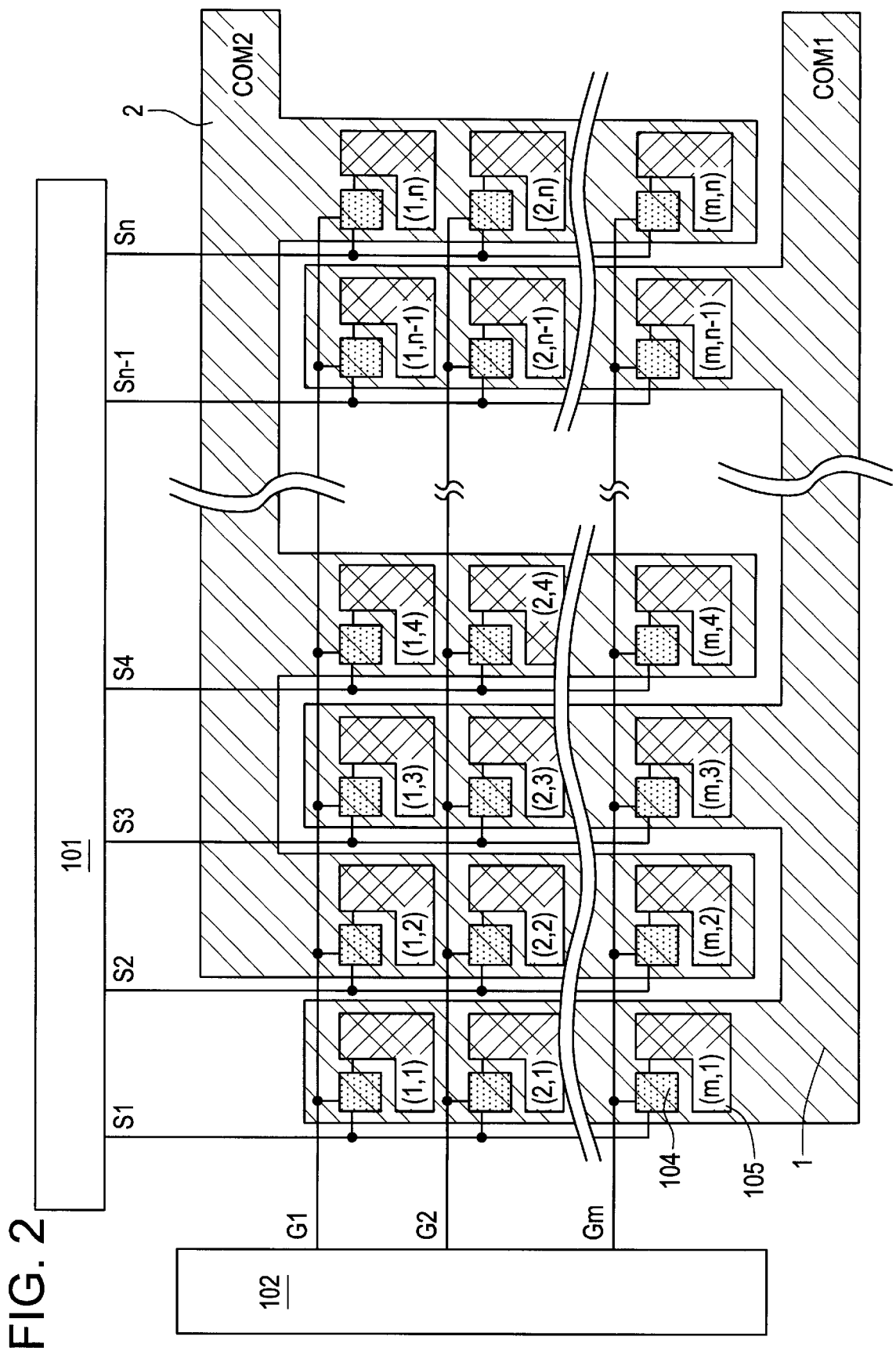
FIG. 2 is a schematic structural view of the active matrix type semiconductor display device of the embodiment of the present invention.

For the purpose of describing the active matrix type liquid crystal display device of this embodiment in more detail, reference will be made to FIG. 2. FIG. 2 schematically shows a portion of the active matrix circuit 103 in the schematic structural view of the active matrix type liquid crystal display device of this embodiment shown in FIG. 1.

In FIG. 2, the pixel TFT (1, 1) to the pixel TFT (m, n), the pixel electrode 105, the counter electrode 1, and the counter electrode 2 are especially schematically shown. As shown in FIG. 2, in the active matrix type liquid crystal display device of this embodiment, the counter electrode 1 and the counter electrode 2 have such shape as to mutually fill gaps. The counter electrode 1 is disposed at an upper portion of those correspondingly to each of the pixels including the pixel TFTs (1, 1) to (m, 1), (1, 3) to (m, 3), . . . , (1, n−1) to (m, n−1) connected to the odd source signal lines (S1, S3, . . . , Sn−1). It can be also said that the counter electrode 1 is disposed at an upper portion of those correspondingly to the pixel electrode 105 connected to each of the pixel TFTs (1, 1) to (m, 1), (1, 3) to (m, 3), . . . , (1, n−1) to (m, n−1) connected to the odd source signal lines (S1, S3, . . . , Sn−1). The counter electrode 2 is disposed correspondingly to each of the pixels including the pixel TFTs (1, 2) to (m, 2), (1, 4) to (m, 4), . . . , (1, n) to (m, n) connected to the even source signal lines (S2, S4, . . . , Sn). It can be also said that the counter electrode 2 is disposed correspondingly to the pixel electrode 105 connected to each of the pixel TFTs (1, 2) to (m, 2), (1, 4) to (m, 4), ..., (1, n) to (m, n) connected to the even source signal lines (S2, S4, ..., Sn).

Thus, the liquid crystals at the pixels (1, 1) to (m, 1), (1, 3) to (m, 3), ..., (1, n−1) to (m, n−1) corresponding to the odd source signal lines are applied with a voltage through the pixel electrodes of those and the counter electrode 1. The liquid crystals at the pixels (1, 2) to (m, 2), (1, 4) to (m, 4), ..., (1, n) to (m, n) corresponding to the even source signal lines are applied with a voltage through the pixel electrodes of those and the counter electrode 2.

Figure 3:
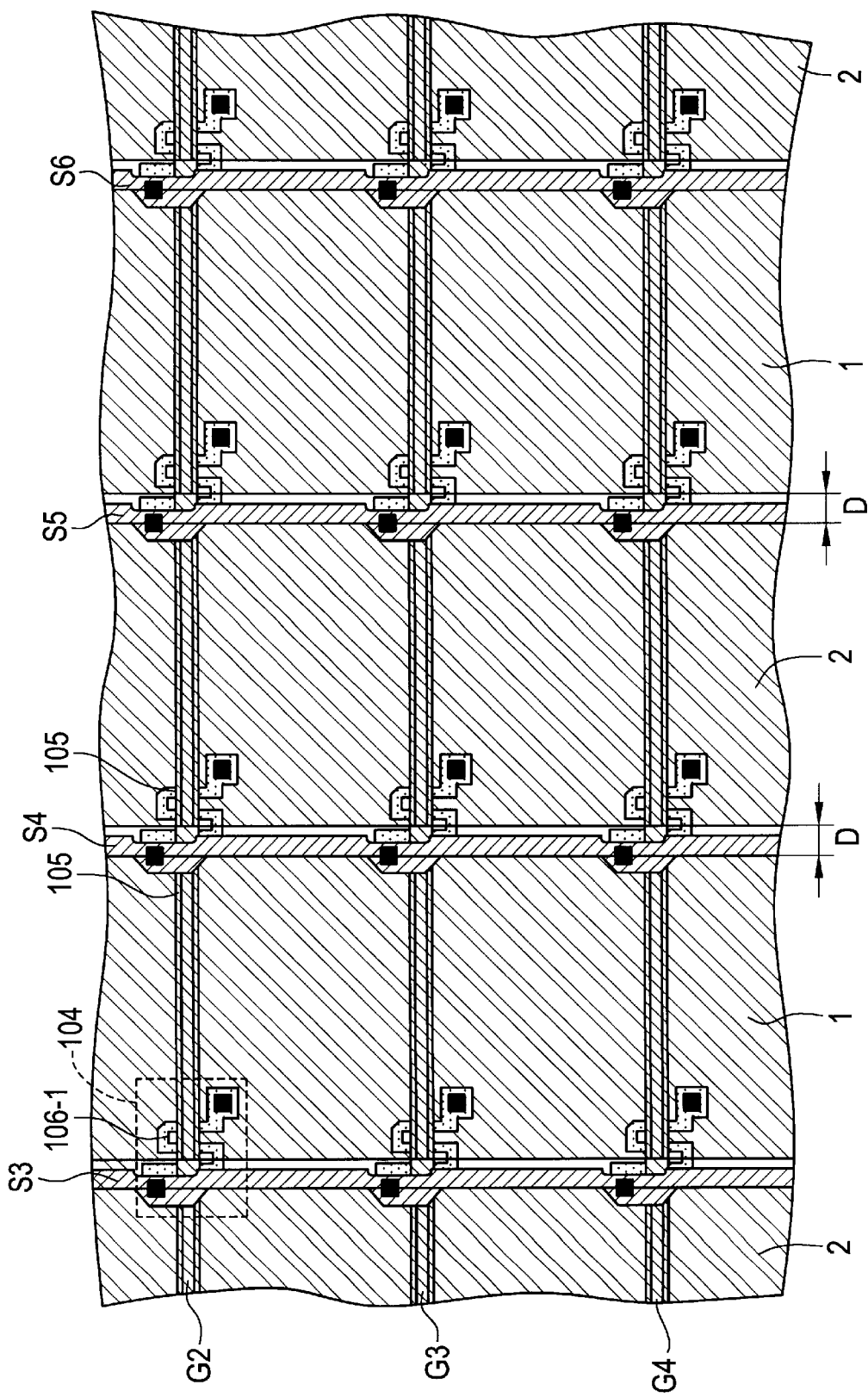
FIG. 3 is an enlarged view of an active matrix circuit of the active matrix type semiconductor display device of the embodiment of the present invention.

FIG. 3 is an enlarged view of part of the active matrix circuit of the active matrix type liquid crystal display device of this embodiment. For convenience of explanation, the scale in the drawing is made different between the vertical and horizontal directions. According to FIG. 3, it can be clearly understood that the counter electrode 1 and the counter electrode 2 have such shape as to mutually fill the gaps. In FIG. 3, blackened portions indicate portions where semiconductor active layers 106-1 are respectively in contact with the source signal lines, and the semiconductor active layers 106-1 are respectively in contact with the pixel electrodes 105.

In this embodiment, L/W (channel length/channel width) of the pixel TFT 104 was made 4 $\mu$m×3 (triple gate)/4 $\mu$m. The size (vertical×horizontal) of one pixel was made 144 $\mu$m×48 $\mu$m. The distance D of a gap formed by the counter electrode 1 and the counter electrode 2 was made D=4.5 $\mu$m.

Figure 4:
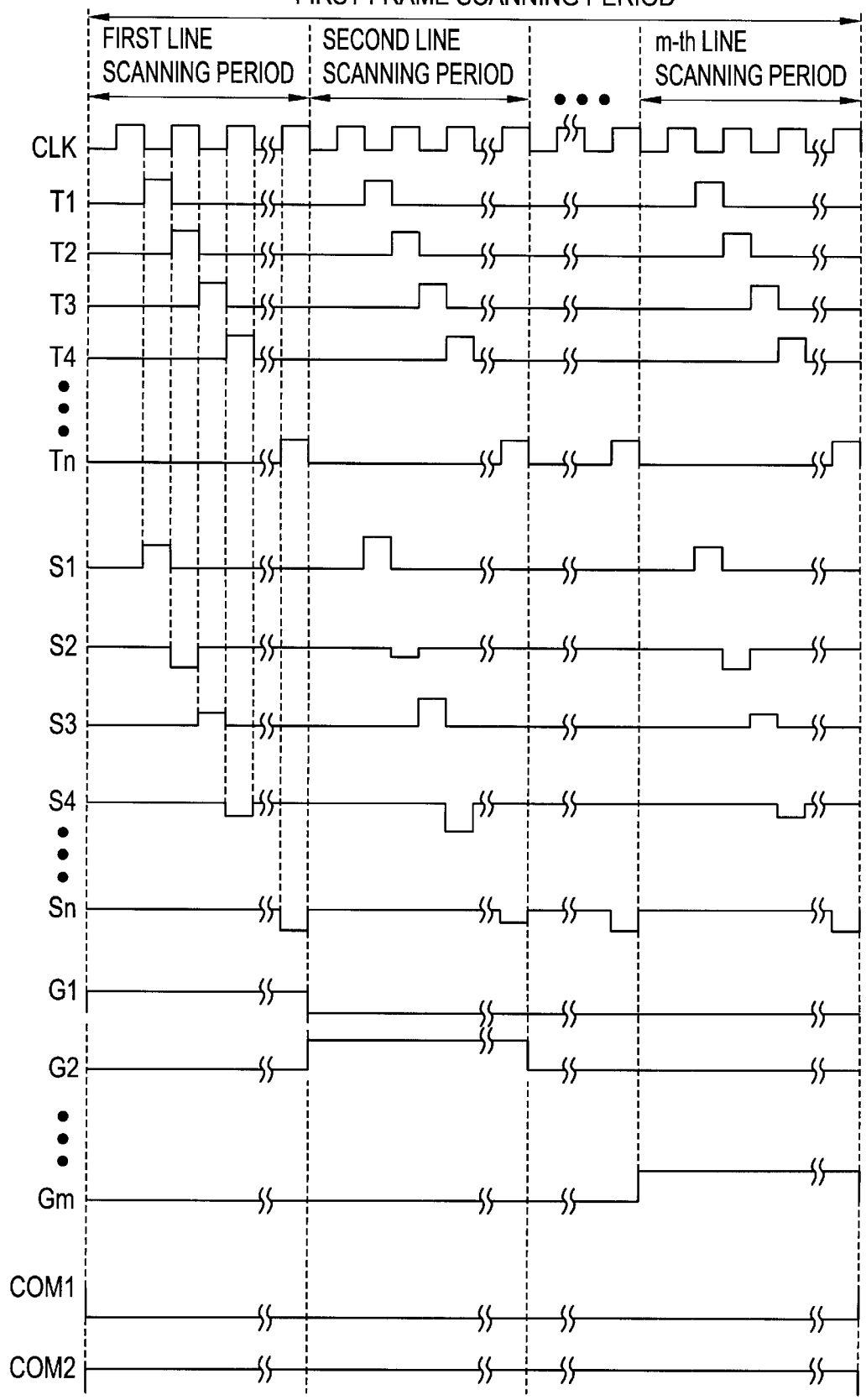
FIG. 4 is an operation timing chart of the active matrix type semiconductor display device of the embodiment of the present invention.
Figure 5:
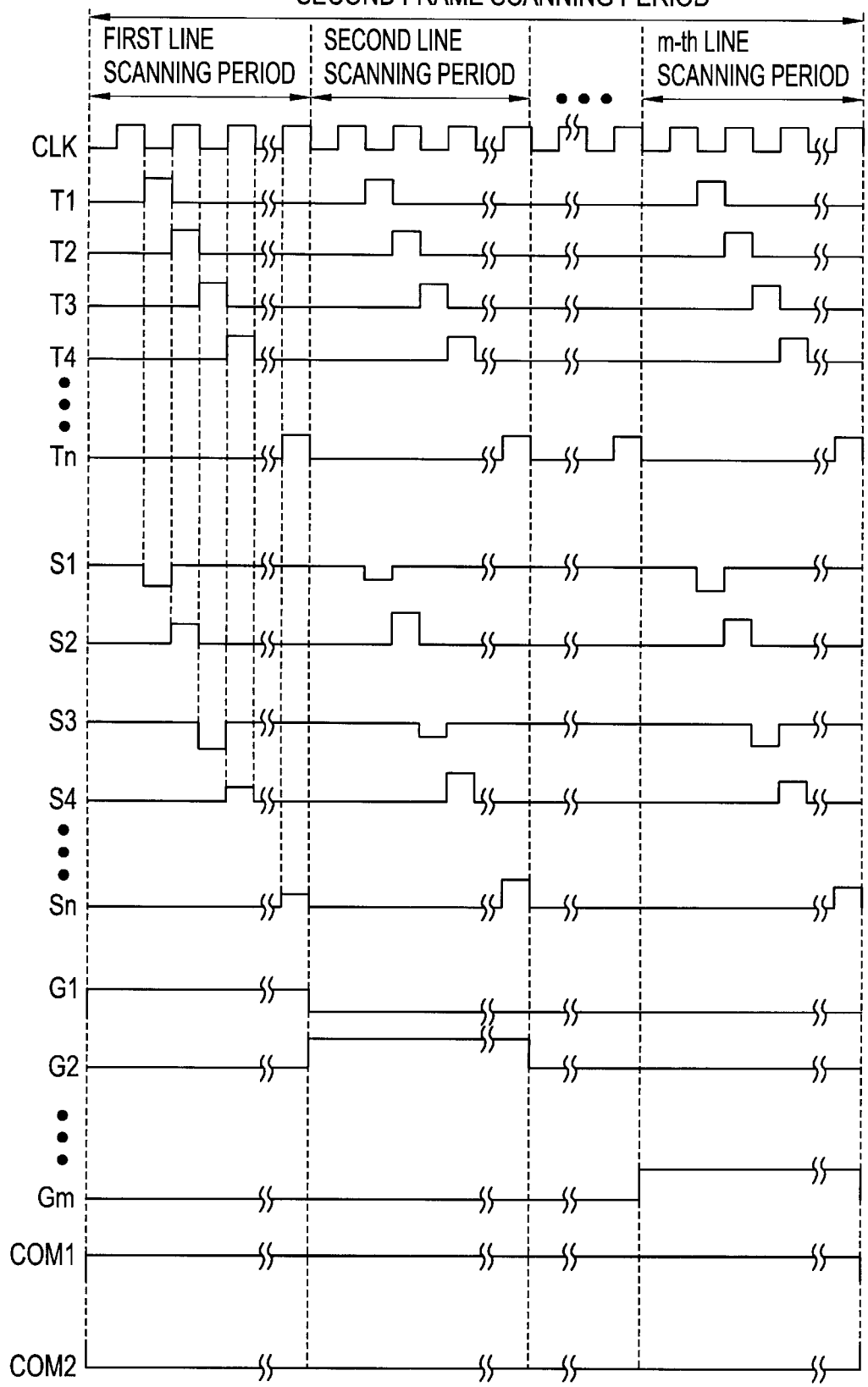
FIG. 5 is an operation timing chart of the active matrix type semiconductor display device of the embodiment of the present invention.

Here, a driving method of the active matrix type liquid crystal display device of this embodiment will be described. FIGS. 4 and 5 are operation timing charts of the active matrix type liquid crystal display device of this embodiment.

First, reference will be made to FIG. 4. FIG. 4 is a timing chart for display of a first frame of the active matrix type liquid crystal display device of this embodiment. Incidentally, in the present specification, display of a frame means display of all the pixels (pixels (1, 1) to (m, n)), and a frame scanning period means a period necessary for writing image signals into all the pixels (pixels (1, 1) to (m, n)). Besides, a line means pixels connected to one gate signal line, and a line scanning period means a period necessary for writing image signals into the pixels (1, 1) to (1, n), or pixels (2, 1) to (2, n), or the like.

Reference character CLK designates a clock signal, and T1 to Tn designate timing signals inputted to analog switches of the source signal line driver circuit. S1 to Sn designate image signals inputted to the source signal lines S1 to Sn, and G1 to Gn designate selection signals inputted to the gate signal lines G1 to Gn. COM1 and COM2 designate potentials of the counter electrode 1 and the counter electrode 2, respectively.

Next, a circuit operation of the active matrix type liquid crystal display device of this embodiment will be described. The clock signal is inputted to the shift register circuit of the source signal line driver circuit. The shift register circuit is operated by the clock signal and a start pulse inputted at the beginning of a line scanning period, and generates timing signals (T1, T2, ..., Tn). The timing signals are amplified by a buffer circuit or a level shifter circuit, and are sequentially inputted to the analog switches. The image signals inputted from the outside are sampled on the basis of the timing signals inputted to the analog switches, and are outputted to the corresponding source signal lines (S1, S2, ..., Sn). Incidentally, the way of forming the timing signals by the source signal line driver circuit is arbitrary.

When a first line (G1) scanning period (period in which writing of pixels corresponding to the gate signal line G1 is carried out) is started, image signals having positive potentials are sequentially supplied to the odd source signal lines, and image signals having negative potentials are supplied to the even source signal lines. Thus, writing of the image signals is sequentially carried out to the pixel TFTs (1, 1) to (1, n) connected to the gate signal line G1, so that the liquid crystal is driven. At this time, a negative potential is applied to the counter electrode 1 (COM1) corresponding to the odd source signal lines, and a positive potential is applied to the counter electrode 2 (COM2) corresponding to the even source signal lines.

When writing of the image signals into the pixel TFTs (1, 1) to (1, n) connected to the gate signal line G1 is ended, a second line (G2) scanning period is next started. Image signals having positive potentials are sequentially supplied to the odd source signal lines, and image signals having negative potentials are supplied to the even source signal lines. Thus, writing of the image signals is sequentially carried out to the pixel TFTs (2, 1) to (2, n) connected to the gate signal line G2, so that the liquid crystal is driven. At this time, a negative potential is applied to the counter electrode 1 (COM1) corresponding to the odd source signal lines, and a positive potential is applied to the counter electrode 2 (COM2) corresponding to the even source signal lines.

When writing of the image signals into the pixel TFTs (2, 1) to (2, n) connected to the gate signal line G2 is ended, a third line (G3) scanning period is next started. Image signals having positive potentials are sequentially supplied to the odd source signal lines, and image signals having negative potentials are supplied to the even source signal lines. Thus, writing of the image signals into the pixel TFTs (3, 1) to (3, n) connected to the gate signal line G3 is sequentially carried out, so that the liquid crystal is driven. At this time, a negative potential is applied to the counter electrode 1 (COM1) corresponding to the odd source signal lines, and a positive potential is applied to the counter electrode (COM2) corresponding to the even source signal lines.

The foregoing operation is sequentially carried out for all the pixel TFTs of one frame (first to nth lines). Thus, the image signals having the positive potentials are sequentially inputted to the odd source signal lines (S1, S3, S5, ..., Sn−1), and the image signals having the negative potentials are sequentially inputted to the even source signal lines (S2, S4, S6, ..., Sn). The so-called source line (column) inversion driving is carried out.

In the first frame scanning period, that is, from the starting time of the first line scanning period to the ending time of the n-th line scanning period, the negative potential is kept to be applied as the potential COM1 of the counter electrode 1 corresponding to the odd source signal lines (S1, S3, S5, , Sn−1), and the positive potential is kept to be applied as the potential COM2 of the counter electrode 2 corresponding to the even source signal lines (S2, S4, S6, ..., Sn). Like this, the potential of the counter electrode is made a potential having a sign opposite to the potential of the image signal applied to the pixel electrode, so that the voltage of the image signal can be made low.

For example, let us consider a case where a liquid crystal with a saturation voltage of 5V is used for the active matrix type liquid crystal display device of this embodiment. When the image signal has a positive potential, a negative potential is applied to the counter electrode. In this case, when a potential of −2V is applied to the counter electrode, the maximum value of the image signal may be 3V. When the image signal has a negative potential, a positive potential is applied to the counter electrode. In this case, when a potential of, for example, 2V is applied to the counter electrode, the maximum value of the image signal may be −3V. Thus, the maximum amplitude of the image signal can be made small, and the consumed power can be reduced.

Next, writing of an image of the second frame will be described. Reference will be made to FIG. 5. After image writing of the first frame is ended, image writing of the second frame is started.

When a first line (G1) scanning period of the second frame is started, image signals having negative potentials are sequentially supplied to the odd source signal lines, and image signals having positive potentials are supplied to the even source signal lines. Thus, writing of the image signals into the pixel TFTs (1, 1) to (1, n) connected to the gate signal lines G1 is sequentially carried out, so that the liquid crystal is driven. At this time, a positive potential is applied to the counter electrode 1 (COM1) corresponding to the odd source signal lines, and a negative potential is applied to the counter electrode 2 (COM2) corresponding to the even source signal lines. Thus, in the second frame, both the potential of the image signal supplied to each of the source signal lines and the potential of the counter electrode are made potentials having a sign opposite to those in the first frame.

When writing of the image signals into the pixel TFTs (1, 1) to (1, n) connected to the gate signal line G1 is ended, a second line (G2) scanning period is next started in the same manner.

The foregoing operation is sequentially carried out for all the pixel TFTs of one frame (first to n-th lines). Thus, the image signals having the negative potentials are sequentially inputted to the odd source signal lines (S1, S3, S5, . . . , Sn−1), and the image signals having the positive potentials are sequentially inputted to the even source signal lines (S2, S4, S6, . . . , Sn).

An image is formed in the manner as described above. In general, images of 60 frames are formed in one second.

In this embodiment, with respect to both the potential of the image signal supplied to each of the source signal lines and the potential of the counter electrode, potentials with opposite signs are applied in the continuous frames so that screen display is made. However, with respect to both the potential of the image signal supplied to each of the source signal lines and the potential of the counter electrode, potentials with the same sign may be applied in the continuous frames so that screen display is made.

Besides, with respect to both the potential of the image signal supplied to each of the source signal lines and the potential of the counter electrode, potentials with the opposite signs may be applied in scanning of the continuous lines so that screen display is made.

Besides, in this embodiment, although n (the number of pixels in the horizontal direction) is an even number, n may be an odd number.

Besides, in this embodiment, although writing of an image into the active matrix circuit is carried out by a dot sequential driving method, writing of an image may be carried out by a line sequential driving method.

Figure 6:
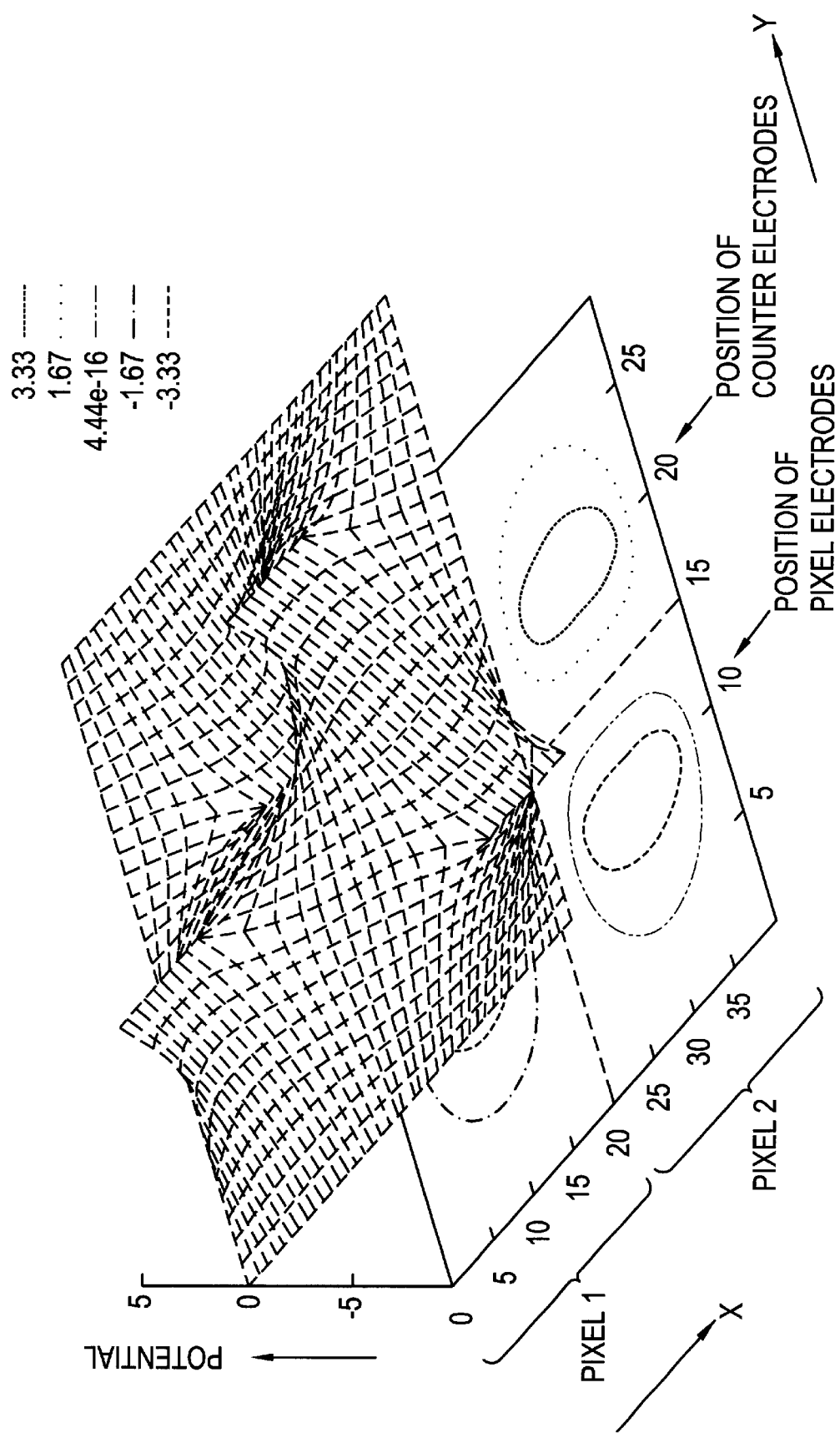
FIG. 6 is a view showing a simulation result of potential distribution characteristics of pixels of the active matrix type semiconductor display device of the present invention.

FIG. 6 shows a simulation result as to potential distribution characteristics of the pixels of the active matrix circuit of the active matrix type semiconductor display device of the present invention. Axes of the graph shown in FIG. 6 indicate a potential V, a direction Y vertical to the substrates on which the pixel electrodes and the counter electrodes are formed, and a direction X parallel to the substrates on which the pixel electrodes and the counter electrodes are formed. Since a scale is arbitrary, it does not directly correspond to an actual value. For example, in the potential V, "5" does not mean 5V. In the direction X parallel to the substrates on which the pixel electrodes and the counter electrodes are formed, 0 to 20 corresponds to a size of one pixel (called pixel 1), and 20 to 40 corresponds to a size of one pixel (called pixel 2). In the direction Y vertical to the substrates on which the pixel electrodes and the counter electrodes are formed, it is set such that the pixel electrodes are positioned at position 10, and the counter electrodes are positioned at position 20. Further, in the direction Y vertical to the substrates on which the pixel electrodes and the counter electrodes are formed, calculation is made on the assumption that potential 0V is at positions 0 and 30. Lines shown on the X-Y plane are coutour lines of potential (equipotential lines) (values of the contour lines of potential are indicated at the right and upper portion in the drawing).

In the simulation shown in FIG. 6, an image signal of a positive potential is applied to the pixel electrode of the pixel 1, and a negative potential is applied to the corresponding counter electrode. An image signal of a negative potential is applied to the pixel electrode of the pixel 2, and a positive potential is applied to the corresponding counter electrode.

From the simulation result of FIG. 6, it is understood that the potential between the pixel electrode and the counter electrode almost linearly changes in any of the pixel 1 and the pixel 2. Thus, it is understood that a uniform potential distribution occurs between the pixel electrode and the counter electrode. That is, it is understood from the simulation result that in the active matrix type liquid crystal display device according to the structure and the driving method as in this embodiment, voltage is uniformly applied to the liquid crystal of each of the pixels. It is also understood that the interaction between adjacent pixels hardly occurs, and an influence such as cross talk does not occur.

Embodiment 2

In this embodiment, a description will be made on an active matrix type liquid crystal display device which is different from the active matrix type liquid crystal display device of the embodiment 1 in the shape of a counter electrode and a driving method.

Figure 7:
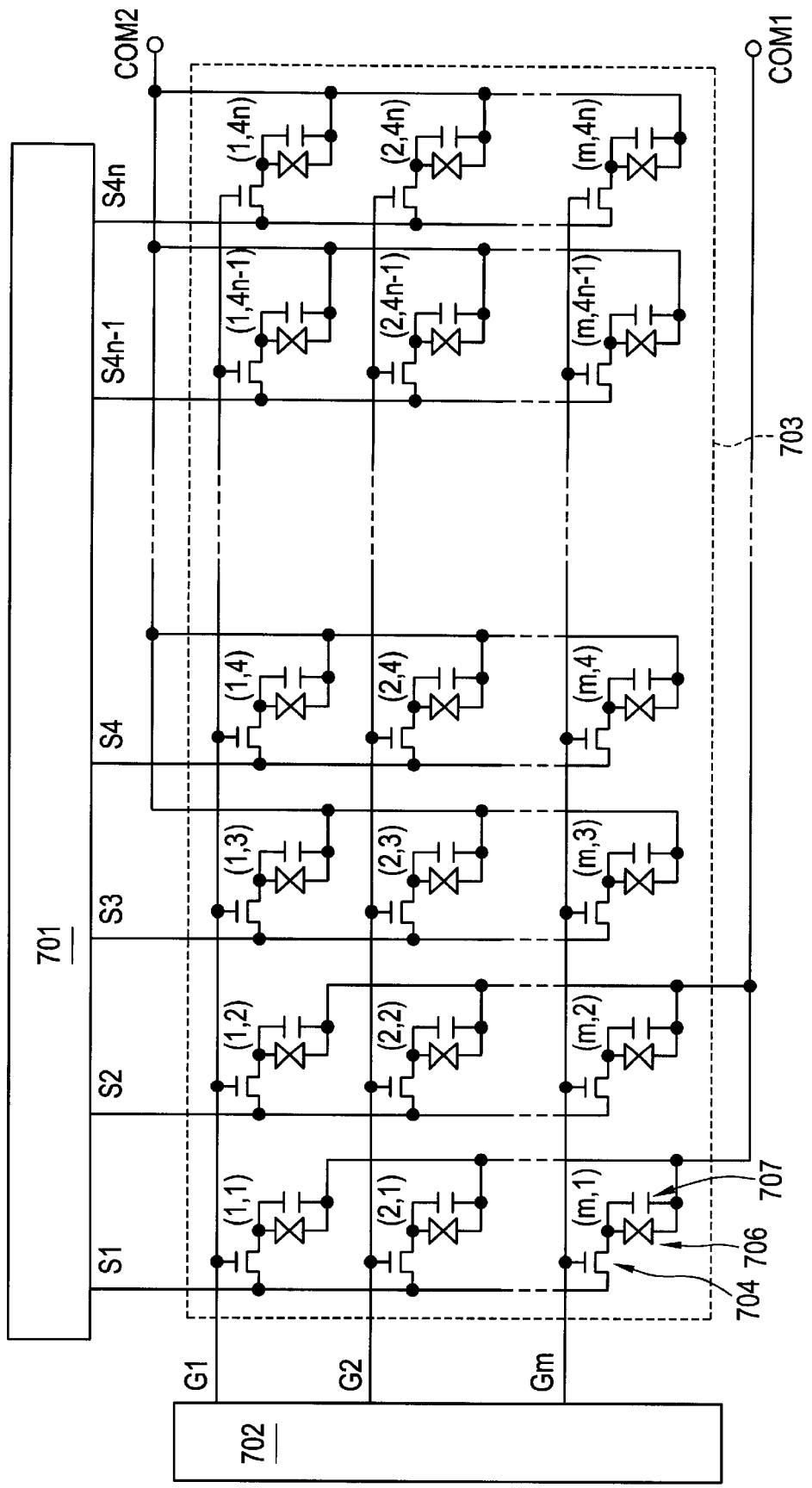
FIG. 7 is a schematic structural view of an active matrix type semiconductor display device of an embodiment of the present invention.

Reference will be made to FIG. 7. FIG. 7 is a schematic structural view of an active matrix type liquid crystal display device of this embodiment. Reference numeral 701 designates a source signal line driver circuit; 702, a gate signal line driver circuit; and 703, an active matrix circuit. The active matrix type liquid crystal display device of this embodiment includes (m×4n) (vertical×horizontal) pixels. Both n and m are natural numbers. For convenience of explanation, reference characters (1, 1) to (m, 4n) are given to the respective pixels. Since the structure of the active matrix circuit is the same as that of the embodiment 1, it is preferable to see the embodiment 1.

A pixel electrode (not shown) is connected to a drain electrode of each of all the pixel TFTs (1, 1) to (m, 1). A counter electrode 1 (not shown) and a counter electrode 2 (not shown) are formed at the side of a counter substrate (not shown). The counter electrode 1 is connected to potential COM1. The counter electrode 2 is connected to potential COM2. The active matrix type liquid crystal display device of this embodiment is different from the active matrix type liquid crystal display device of the embodiment 1 in the shape of the counter electrode.

Figure 8:
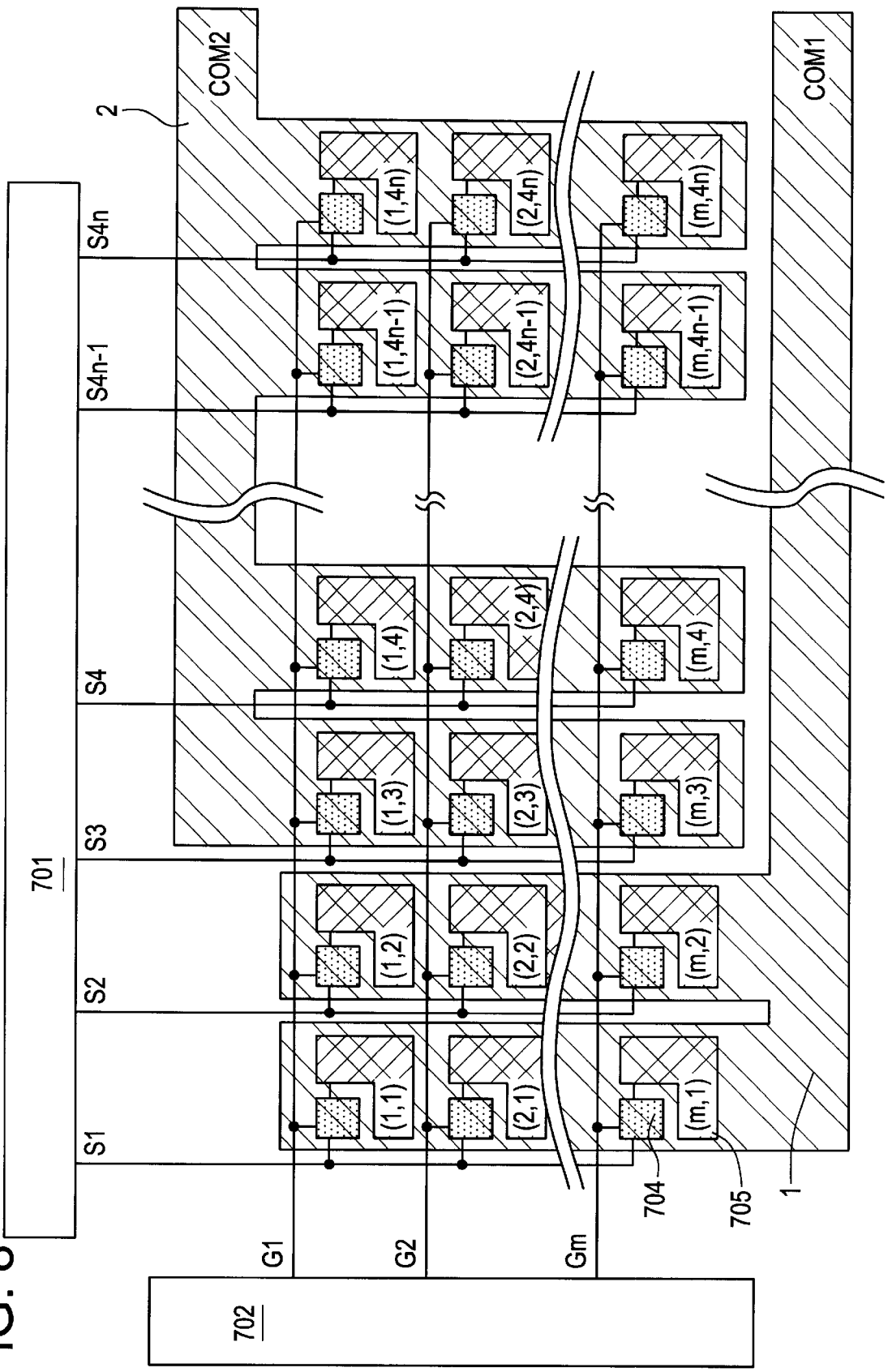
FIG. 8 is a schematic structural view of the active matrix type semiconductor display device of the embodiment of the present invention.

Reference will be made to FIG. 8 in order to describe the active matrix type liquid crystal display device of this embodiment in more detail. FIG. 8 schematically shows a portion of the active matrix circuit 703 in the schematic structural view of the active matrix type liquid crystal display device of this embodiment shown in FIG. 7. In FIG. 8, the pixel TFT (1, 1) to the pixel TFT (m, 4n), the pixel electrode 705, the counter electrode 1, and the counter electrode 2 are especially schematically shown. As shown in FIG. 8, in the active matrix type liquid crystal display device of this embodiment, the counter electrode 1 and the counter electrode 2 respectively correspond to two source signal lines at every four source signal lines and have such shape as to mutually fill gaps. That is, the counter electrode 1 is disposed correspondingly to each of the pixels including the pixel TFTs (1, 1) to (m, 1), (1, 2) to (m, 2), (1, 5) to (m, 5), (1, 6) to (m, 6), . . . , (1, 4n−3) to (m, 4n−3), and (1, 4n−2) to (m, 4n−2) connected to the source signal lines (S1, S2, S5, S6, . . . , S4n−3, S4n−2). It can be also said that the counter electrode 1 is disposed correspondingly to the pixel electrode 705 connected to each of the pixel TFTs (1, 1) to (m, 1), (1, 2) to (m, 2), (1, 5) to (m, 5), (1, 6) to (m, 6), . . . , (1, 4n−3) to (m, 4n−3), and (1, 4n−2) to (m, 4n−2) connected to the source signal lines (S1, S2, S5, S6, . . . , S4n−3, S4n−2). The counter electrode 2 is disposed correspondingly to each of the pixels including the pixel TFTs (1, 3) to (m, 3), (1, 4) to (m, 4), (1, 7) to (m, 7), (1, 8) to (m, 8), . . . , (1, 4n−1) to (m, 4n−1), (1, 4n) to (m, 4n) connected to the source signal lines (S3, S4, S7, S8, . . . , S4n−1, S4n). It can also be said that the counter electrode 2 is disposed correspondingly to the pixel electrode 705 connected to each of the pixel TFTs (1, 3) to (m, 3), (1, 4) to (m, 4), (1, 7) to (m, 7), (1, 8) to (m, 8), . . . , (1, 4n−1) to (m, 4n−1), (1, 4n) to (m, 4n) connected to the source signal lines (S3, S4, S7, S8, . . . , S4n−1, S4n).

The counter electrode 1 and the counter electrode 2 are designed such that different potentials from each other, precisely, opposite potentials to each other are supplied similarly to the embodiment 1.

Besides, in this embodiment, although the description will be made on the active matrix type liquid crystal display device including m×4n (vertical×horizontal) pixels, the number of pixels is not limited to this.

Figure 9:
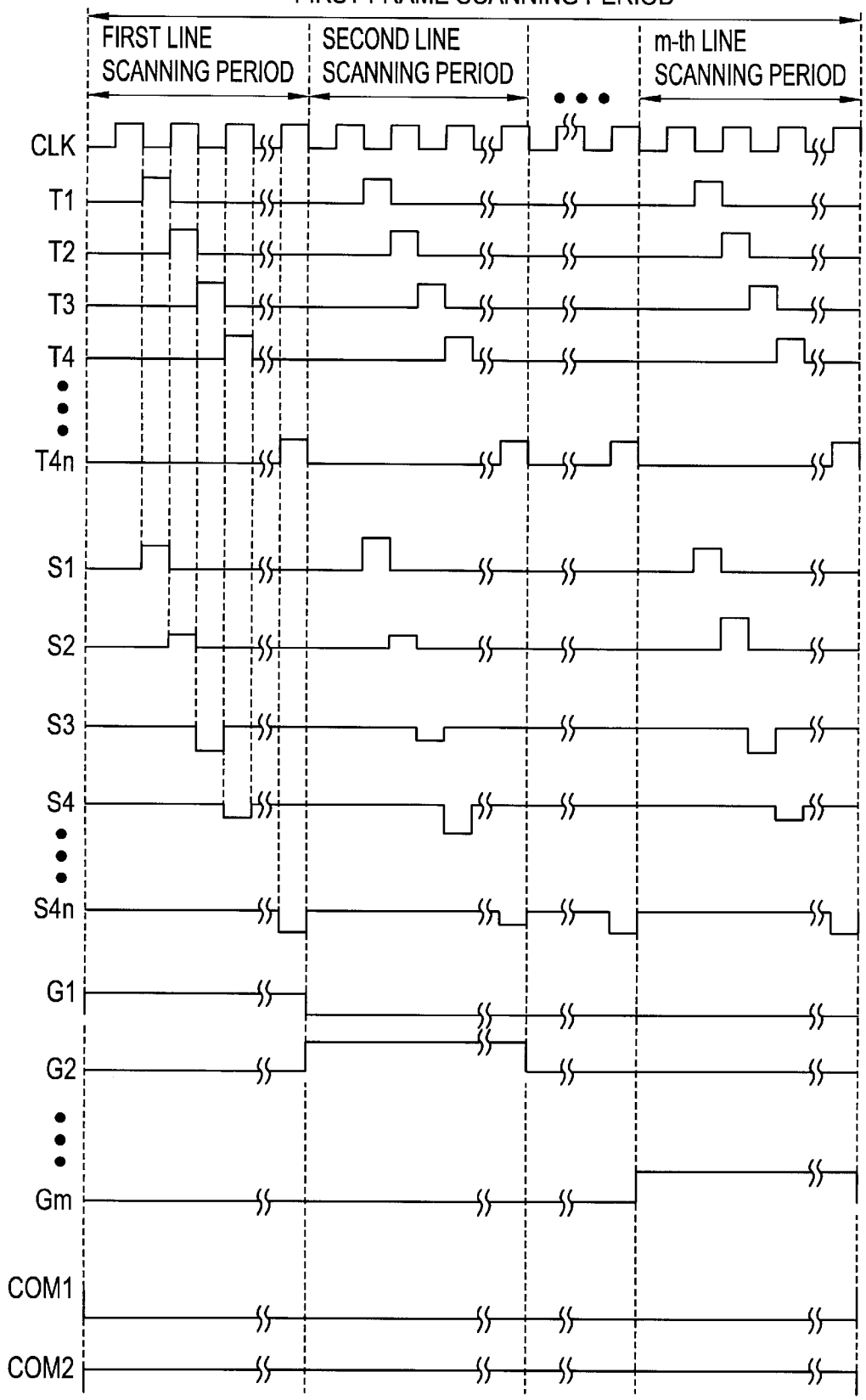
FIG. 9 is an operation timing chart of the active matrix type semiconductor display device of the embodiment of the present invention.

Next, an operation of the active matrix type liquid crystal display device of this embodiment will be described. First, reference will be made to FIG. 9. FIG. 9 is a timing chart for display of a first frame of the active matrix type liquid crystal display device of this embodiment. Similarly to the embodiment 1, display of a frame means display of all the pixels (pixels (1, 1) to (m, 4n)), and a frame scanning period means a period necessary for writing image signals into all the pixels (pixels (1, 1) to (m, 4n)).

When a first line (G1) scanning period (period in which writing of pixels corresponding to a gate signal line G1 is carried out) is started, image signals having positive potentials are sequentially supplied to the (4n−3)th and (4n−2)th source signal lines, and image signals having negative potentials are supplied to the (4n−1)th and 4nth source signal lines. Thus, writing of the image signals into the pixel TFTs (1, 1) to (1, 4n) connected to the gate signal line G1 is sequentially carried out, so that the liquid crystal is driven. At this time, a negative potential is applied to the counter electrode 1 (COM1) corresponding to the (4n−3)th and (4n−2)th source signal lines, and a positive potential is applied to the counter electrode 2 (COM2) corresponding to the (4n−1)th and 4nth source signal lines.

When writing of the image signals into the pixel TFTs (1, 1) to (1, 4n) connected to the gate signal line G1 is ended, a second line (G2) scanning period is next started, and image signals having positive potentials are sequentially supplied to the (4n−3)th and (4n−2)th source signal lines, and image signals having negative potentials are supplied to the (4n−1)th and 4nth source signal lines. Thus, writing of the image signals into the pixel TFTs (2, 1) to (2, 4n) connected to the gate signal line G2 is sequentially carried out, so that the liquid crystal is driven. At this time, a negative potential is applied to the counter electrode 1 (COM1) corresponding to (4n−3)th and (4n−2)th source signal lines, and a positive potential is applied to the counter electrode 2 (COM2) corresponding to the (4n−1)th and 4nth source signal lines.

When writing of the image signals into the pixel TFTs (2, 1) to (2, 4n) connected to the gate signal line G2 is ended, a third line (G3) scanning period is next started, and image signals having positive potentials are sequentially supplied to the (4n−3)th and (4n−2)th source signal lines, and image signals having negative potentials are supplied to the (4n−1)th and 4nth source signal lines. Thus, writing of the image signals into the pixel TFTs (3, 1) to (3, 4n) connected to the gate signal line G3 is sequentially carried out, so that the liquid crystal is driven. At this time, a negative potential is applied to the counter electrode 1 (COM1) corresponding to the (4n−3)th and (4n−2)th source signal lines, and a positive potential is applied to the counter electrode 2 (COM2) corresponding to the (4n−1)th and 4nth source signal lines.

The foregoing operation is carried out for all the pixel TFTs of one frame (first to 4nth lines). Thus, image signals having positive potentials are sequentially inputted to the (4n−3)th and (4n−2)th source signal lines, and image signals having negative potentials are sequentially inputted to the (4n−1)th and 4nth source signal lines. The so-called source line (column) inversion driving at every two source signal lines is carried out.

The foregoing operation is carried out for all the pixel TFTs of one frame (first to 4nth lines).

Thus, also in this embodiment, the potential of the counter electrode is made a potential having a sign opposite to the potential of the image signal applied to each of the pixel electrodes, so that the voltage of the image signal can be made low.

Figure 10:
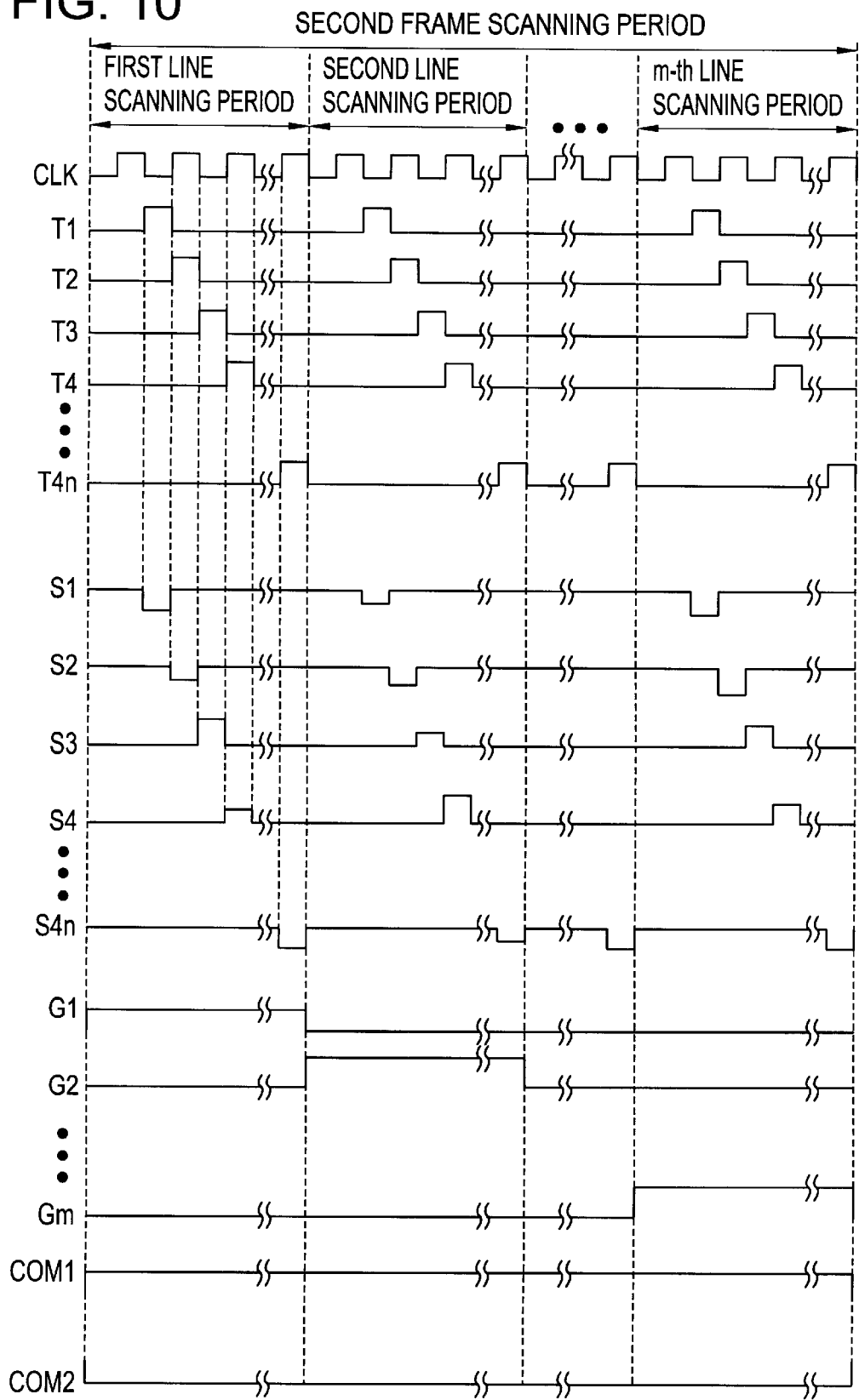
FIG. 10 is an operation timing chart of the active matrix type semiconductor display device of the embodiment of the present invention.

In a second frame, as shown in FIG. 10, an image signal with a sign opposite to that of the first frame scanning period is supplied to each of the source signal lines. A potential with a sign opposite to that of the first frame scanning period is supplied to each of the counter electrode 1 and the counter electrode 2.

In this embodiment, with respect to both the potential of the image signal supplied to each of the source signal lines and the potential of the counter electrode, potentials with opposite signs may be applied in the continuous frames so that screen display is made. However, with respect to both the potential of the image signal supplied to each of the source signal lines and the potential of the counter electrode, potentials with the same sign may be applied in the continuous frames so that screen display is made.

Besides, with respect to both the potential of the image signal supplied to each of the source signal lines and the potential of the counter electrode, potentials with the opposite signs may be applied in scanning of the continuous lines so that screen display is made.

Besides, the number of pixels of the active matrix type liquid crystal display device may be a number other than m x 4n. Besides, although the two counter electrodes each corresponding to two source signal lines at every four source signal lines are used, two counter electrodes corresponding to z source signal lines at every 2z source signal lines may be used.

Besides, in this embodiment, although writing of an image into the active matrix circuit is carried out by a dot sequential driving method, writing of an image may be carried out by a line sequential driving method.

Embodiment 3

In this embodiment, a description will be made on an example of a fabricating method of the active matrix type liquid crystal display device described in the embodiment 1 and the embodiment 2. In this embodiment, an example in which a plurality of TFTs are formed on a substrate having an insulating surface, and an active matrix circuit, a driver circuit, and a logic circuit, etc. are monolithically constructed, will be described with reference to FIGS. 11E to 13D. In this embodiment, a state where a CMOS circuit as a basic circuit of the driver circuit, and the logic circuit, or the like will be described. Although the description will be made on the CMOS circuit in which a P-channel TFT (PTFT) and an N-channel TFT (NTFT) are respectively provided with one gate electrode, a CMOS circuit of a TFT provided with a plurality of gate electrodes, such as a double gate type or triple gate type, can be fabricated in the same manner. A pixel TFT is also formed of an N-channel TFT.

First, an under film made of a silicon oxide film 1102 and having a thickness of 200 nm was formed on a glass substrate 1101. The under film may be a laminate including a silicon nitride film, or may be formed of only a silicon nitride film.

Next, an amorphous silicon film (noncrystalline silicon film) having a thickness of 30 nm was formed on the silicon oxide film 1102 by the Plasma CVD method, and after a dehydrogenating process, excimer laser annealing was carried out to form a polysilicon film (crystalline silicon film or polycrystalline silicon film).

A well-known laser crystallizing technique or thermal crystallizing technique may be used for this crystallizing step. In this embodiment, a beam of a pulse oscillation type KrF excimer laser was processed into a linear beam and crystallization of the amorphous silicon film was carried out.

In this embodiment, the initial film was made the amorphous silicon film and was crystallized by the laser annealing so that the polysilicon film was obtained. However, a microcrystalline silicon film may be used as an initial film, or a polysilicon film may be directly formed. Of course, laser annealing may be carried out for the formed polysilicon film. Instead of the laser annealing, furnace annealing may be carried out.

The thus formed crystalline silicon film was patterned so that active layers 1103 and 1104 made of island-like silicon layers were formed.

Figure 11A:
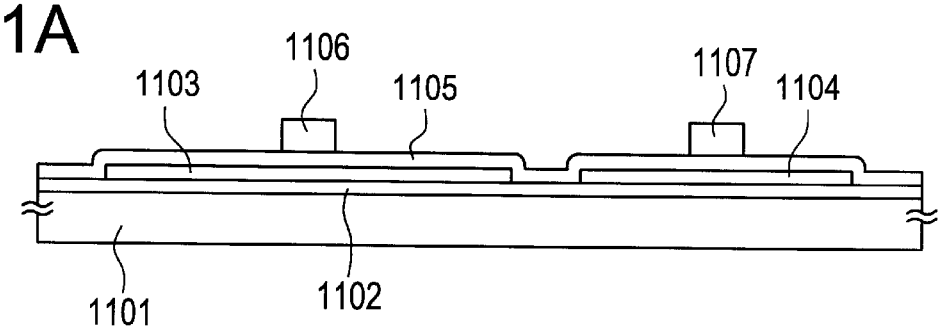
FIGS. 11A to 11E are views showing an example of fabricating steps of an active matrix type semiconductor display device of the present invention.

Next, a gate insulating film 1105 made of a silicon oxide film is formed to cover the active layers 1103 and 1104, and gate wirings (including gate electrode) 1106 and 1107 made of a laminate structure of tantalum and tantalum nitride were formed thereon (FIG. 11A).

The thickness of the gate insulating film 1105 was made 100 nm. Of course, instead of the silicon oxide film, a laminate structure of a silicon oxide film and a silicon nitride film, or a silicon nitride oxide film (silicon oxynitride film) may be used. Although other metals may be used for the gate wirings 1106 and 1107, it is desirable to use a material having a high etching selection ratio with respect to silicon in a subsequent step.

After the state of FIG. 11A was obtained in this way, a first phosphorus doping step (adding step of phosphorus) was carried out. Here, in order to add phosphorus through the gate insulating film 1105, an acceleration voltage was set as high as 80 KeV. A dose amount was adjusted such that first impurity regions 1108 and 1109 formed in this way had a length (width) of 0.5 $\mu$m and a phosphorus concentration of $1\times10^{17}$ atoms/cm$^3$. The phosphorus concentration at this time is expressed by (n–). Arsenic may be used instead of phosphorus.

Figure 11B:
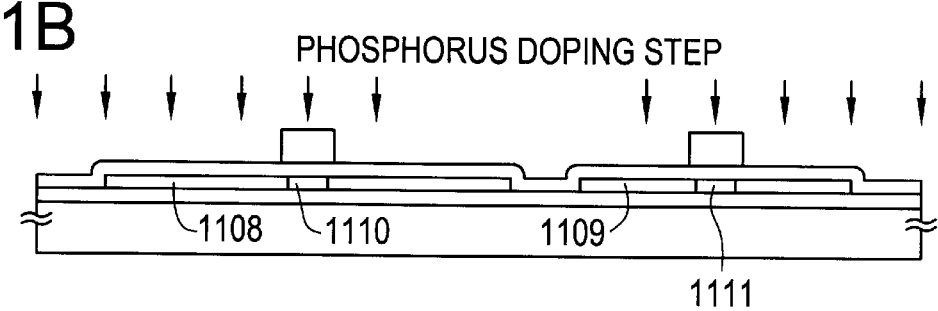

The first impurity regions 1108 and 1109 were formed using the gate wirings 1106 and 1107 as masks in a self-aligning manner. At this time, intrinsic crystalline silicon layers remained just under the gate wirings 1106 and 1107, and channel formation regions 1110 and 1111 were formed. However, since some phosphorus actually went around into the inside of the gate wiring and was added, such a structure was made that the gate wirings 1106 and 1107 overlap with the first impurity regions 1108 and 1109 (FIG. 11B).

Next, an amorphous silicon layer having a thickness of 0.1 to 1 $\mu$m (typically 0.2 to 0.3 $\mu$m) was formed so as to cover the gate wirings 1106 and 1107, and anisotropic etching was carried out so that side walls 1112 and 1113 were formed. The width (thickness viewed from a side wall of the gate wiring) of the side walls 1112 and 1113 was made 0.2 $\mu$m (FIG. 11C).

In this embodiment, since a layer in which any impurity was not added was used as the amorphous silicon layer, the side wall made of an intrinsic silicon layer was formed.

Figure 11C:
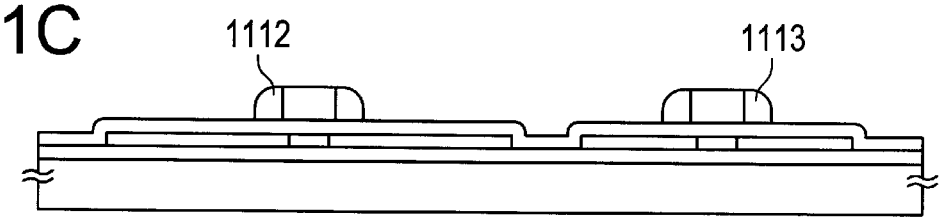

After the state of FIG. 11C was obtained, a second phosphorus doping step was carried out. Also in this case, an acceleration voltage was made 80 KeV similarly to the first case. A dose amount was adjusted such that second impurity regions 1114 and 1115 formed at this time contained phosphorus at a concentration of $1\times10^{18}$ atoms/cm$^3$. The phosphorus concentration at this time is expressed by (n).

Figure 11D:
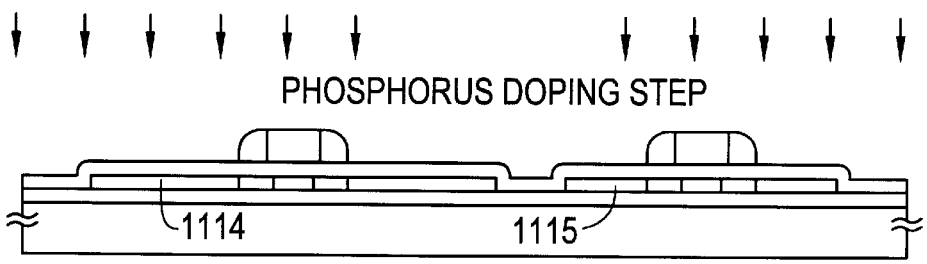

In the phosphorus doping step shown in FIG. 11D, the first impurity regions 1108 and 1109 remain just under the side walls 1112 and 1113. The first impurity regions 1108 and 1109 come to function as first LDD regions.

Besides, in the step of FIG. 11D, phosphorus was also added in the side walls 1112 and 1113. Since the acceleration voltage was high, phosphorus was actually distributed in such a state that the tail (bottom) of a concentration profile of phosphorus spreads in the inside of the side wall. Although a resistance component of the side wall can be adjusted by this phosphorus, if the concentration distribution of phosphorus extremely fluctuates, such a state can be caused that a gate voltage applied to the second impurity region 1114 changes for every component. Thus, precise control is necessary at the time of doping.

Next, a resist mask 1116 covering a part of the NTFT and a resist mask 1117 covering all the PTFT were formed. The gate insulating film 1105 was subjected to dry etching in this state so that a processed gate insulating film 1118 was formed (FIG. 11E).

At this time, the length of a portion of the gate insulating film 1118 projecting toward the outside of the side wall 1112 (length of a portion of the gate insulating film 1118 which is in contact with the second impurity region 1114) determined the length (width) of the second impurity region 1114. Thus, it was necessary to accurately carry out masking of the resist mask 1116.

Figure 11E:
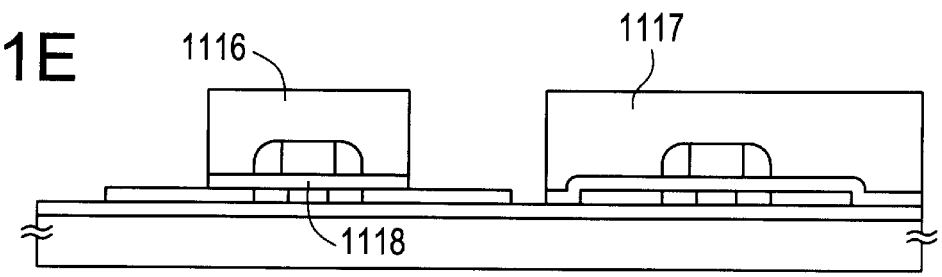
Figure 12A:
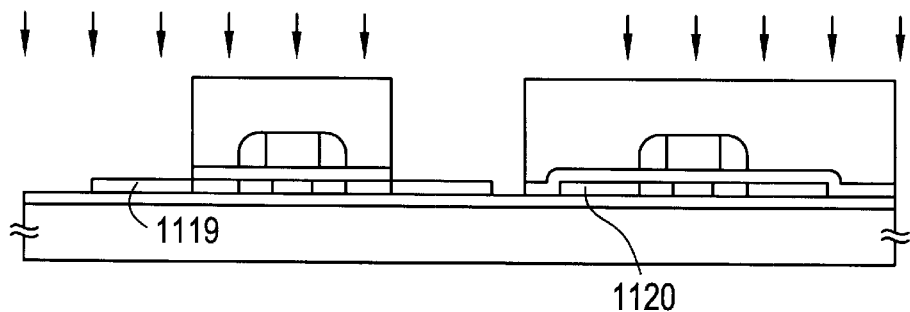
FIGS. 12A to 12D are views showing an example of fabricating steps of the active matrix type semiconductor display device of the present invention.

After the state of FIG. 11E was obtained, a third phosphorus doping step was carried out. Since phosphorus was added into an exposed active layer at this time, an acceleration voltage was set as low as 10 KeV. A dose amount was adjusted such that a third impurity region 1119 formed in this way contained phosphorus at a concentration of $5 \times 10^{20}$ atoms/cm$^3$. The phosphorus concentration at this time is expressed by (n+) (FIG. 12A).

Since phosphorus is not added in portions shielded with the resist masks 1116 and 1117, the second impurity regions 1114 and 1115 remain at the portions as they are. Thus, the second impurity region 1114 was defined. At the same time, the third impurity region 1119 was defined.

This second impurity region 1114 functions as a second LDD region, and the third impurity region 1119 comes to function as a source region or drain region.

Next, the resist masks 1116 and 1117 were removed, and a resist mask 1121 covering all the NTFT was newly formed. The side wall 1113 of the PTFT was first removed, and further, the gate insulating film 1105 was subjected to dry etching so that a gate insulating film 1122 having the same shape as the wiring 1107 was formed (FIG. 12B).

Figure 12B:
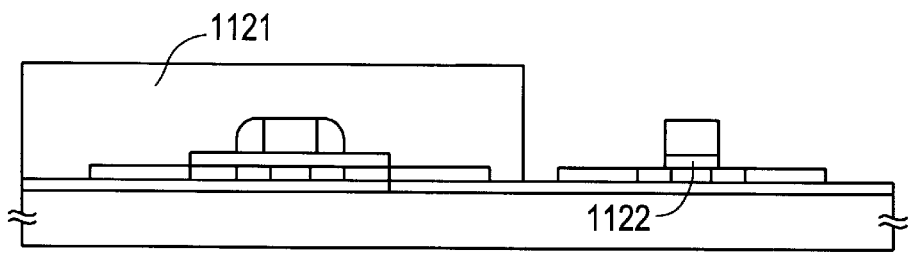

After the state of FIG. 12B was obtained, a boron doping step (adding step of boron) was carried out. Here, an acceleration voltage was made 10 KeV, and a dose amount was adjusted such that a fourth impurity region 1123 contained boron at a concentration of $3 \times 10^{20}$ atoms/cm$^3$. The boron concentration at this time is expressed by (p++) (FIG. 12C).

At this time, since boron went around into the inside of the gate wiring 1107 and was added, the channel formation region 1111 was formed inside of the gate wiring 1107. In this step, the first impurity region 1109 and the second impurity region 1115 formed at the PTFT side are inverted by boron into a P type. Thus, although a resistance value is changed in the portion which was originally the first impurity region and the portion which was originally the second impurity region, since boron is added at a sufficiently high concentration, a problem does not occur.

By doing so, a fourth impurity region 1123 is defined. The fourth impurity region 1123 is formed using the gate wiring 1107 as a mask completely in a self-aligning manner, and functions as a source region or drain region. In this embodiment, although neither an LDD region nor an offset region is not formed for the PTFT, since the PTFT has originally high reliability, there is no problem. Rather, since a larger on current can be secured when the LDD region etc. is not provided, there is also an advantageous case.

Figure 12C:
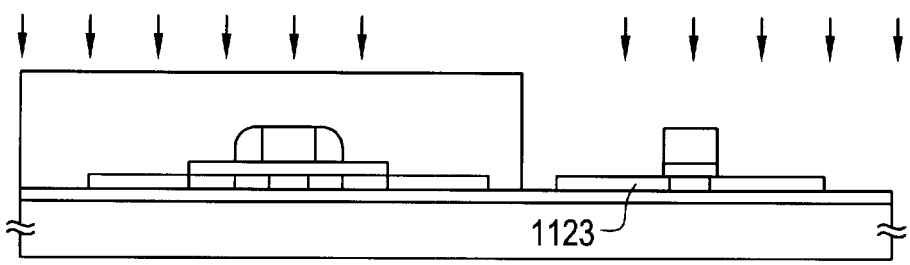

In this way, as shown in FIG. 12C, the channel formation region, the first impurity region, the second impurity region, and the third impurity region are finally formed in the active layer of the NTFT, and only the channel formation region and the fourth impurity region are formed in the active layer of the PTFT.

After the state of FIG. 12C was obtained in this way, a first interlayer insulating film 1124 having a thickness of 1 μm was formed. A silicon oxide film, a silicon nitride film, a silicon nitride oxide film (silicon oxynitride film), an organic resin film, or a laminate film of those can be used as the interlayer insulating film 1124. In this embodiment, an acryl resin film was adopted.

After the first interlayer insulating film 1124 was formed, source wirings 1125 and 1126, and a drain wiring 1127, which were made of metal material, were formed. This embodiment employed a three-layer wiring line having such a structure that an aluminum film containing titanium was sandwiched between titanium films.

In the case where a resin film called BCB (benzocyclobutene) is used as the first interlayer insulating film 1124, flatness is increased, and at the same time, it becomes possible to use copper as a wiring material. Since copper has low wire resistance, it is very effective as a wiring material.

After the source wirings and the drain wiring were formed in this way, a silicon nitride film 1128 having a thickness of 50 nm was formed as a passivation film. Further, a second interlayer insulating film 1129 was formed thereon as a protective film. As the second interlayer insulating film 1129, it is possible to use a material similar to the one for the first interlayer insulating film 1124. This embodiment adopted such a structure that an acryl resin film was laminated on a silicon oxide film having a thickness of 50 nm.

Figure 12D:
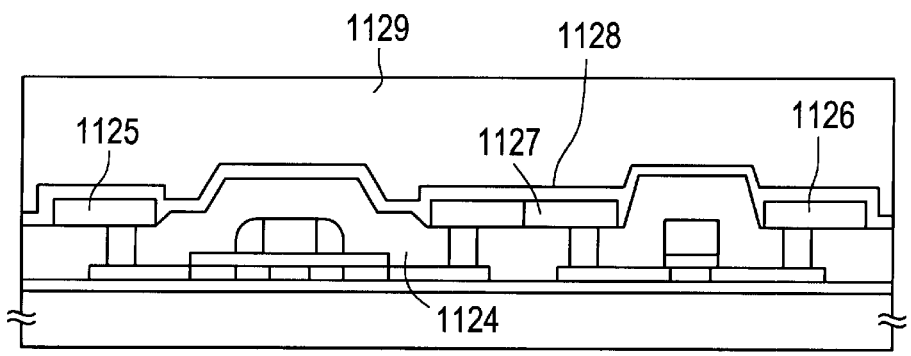

Through the steps as described above, the CMOS circuit having a structure as shown in FIG. 12D was completed. In the CMOS circuit formed in this embodiment, since the NTFT had superior reliability, the reliability for the whole circuit was greatly improved. Besides, when the structure as in this embodiment was adopted, characteristic balance (balance of electrical characteristic) between the NTFT and PTFT became superior.

Incidentally, a pixel TFT can be also constructed by an NTFT in the same manner.

After the state of FIG. 12D was obtained, a contact hole is bored, and a pixel electrode connected to a drain electrode of a pixel TFT is formed. Then a third interlayer insulating film is formed, and an oriented film is formed. In this embodiment, polyimide was used for the oriented film. According to necessity, a black matrix may be formed.

Next, a counter substrate is prepared. The counter substrate is constituted by a glass substrate, a counter electrode made of a transparent conductive film, and an oriented film. The counter electrode is processed into a shape as described in the embodiment 1 and the embodiment 2.

In this embodiment, a polyimide film was used for the oriented film. After the oriented film was formed, a rubbing process was carried out. In this embodiment, polyimide having a relatively large pretilt angle was used for the oriented film.

Next, the active matrix substrate and the counter substrate obtained through the foregoing steps are bonded to each other by a well-known cell assembling process through a sealing material, a spacer, etc. Thereafter, a liquid crystal is injected between both the substrates, and is completely sealed with a sealing agent. In this embodiment, a nematic liquid crystal was used for the liquid crystal.

Thus, a transmission type active matrix type liquid crystal display device is completed.

Embodiment 4

In this embodiment, a description will be made on an example where a crystalline semiconductor film which becomes an active layer in the embodiment 3 is formed by a thermal crystallization method using a catalytic element. In the case where the catalytic element is used, it is preferable to use a technique disclosed in Japanese Unexamined Patent Publication No. Hei. 7-130652 and No. Hei. 8-78329 by the same assignee as this application.

Figure 13A:
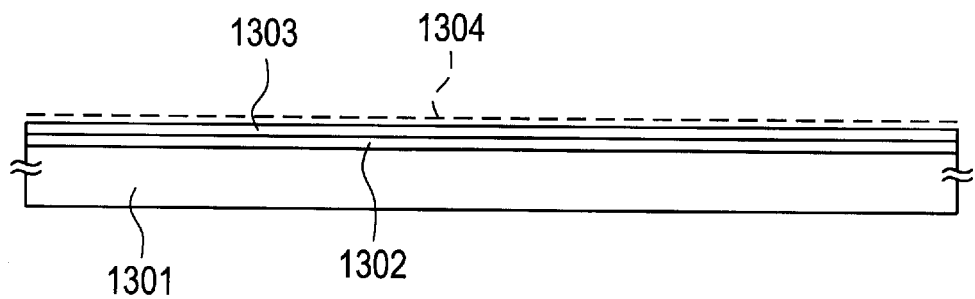
FIGS. 13A and 13B are views showing an example of fabricating steps of an active matrix type semiconductor display device of the present invention.
Figure 13B:
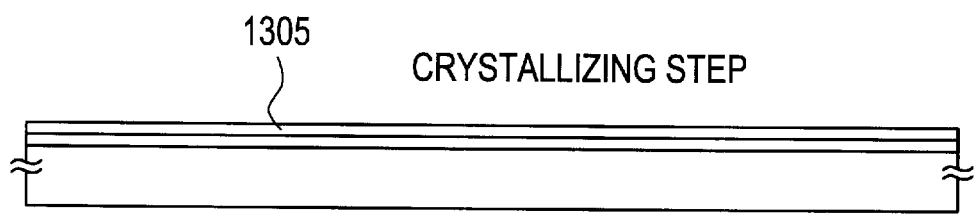

Here, an example where the technique disclosed in Japanese Patent Unexamined Publication No. Hei. 7-130652 is applied to the present invention will be shown in FIGS. 13A and 13B. First, a silicon oxide film 1302 was formed on a silicon substrate 1301 by a thermal oxidation method, and an amorphous silicon film 1303 was formed thereon. Further, a nickel acetate salt solution containing nickel of 10 ppm in terms of weight was applied to form a nickel containing layer 1304 (FIG. 13A).

Next, after a dehydrogenating step at 500° C. for 1 hour, a heat treatment at 500 to 650° C. for 4 to 12 hours (in this embodiment, at 550° C. for 8 hours) was carried out, and a polysilicon film 1305 was formed. The polysilicon film 1305 obtained in this way had extremely superior crystallinity (FIG. 13B).

Thereafter, the polysilicon film 1305 was patterned to form an active layer, and a TFT was fabricated through the same steps as those of the embodiment 3.

The technique disclosed in Japanese Patent Unexamined Publication No. Hei. 8-78329 is such that selective crystallization of an amorphous semiconductor film is made possible by selectively adding a catalytic element. A case where the technique is applied to the present invention will be described with reference to FIGS. 14A and 14B.

First, a silicon oxide film 1402 was formed on a glass substrate 1401, and an amorphous silicon film 1403 and a silicon oxide film 1404 were continuously formed thereon. At this time, the thickness of the silicon oxide film 1404 was made 150 nm.

Figure 14A:
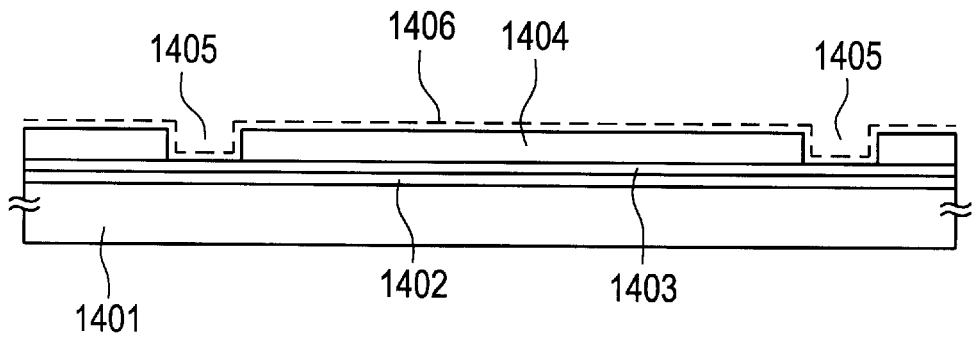
FIGS. 14A and 14B are views showing an example of fabricating steps of an active matrix type semiconductor display device of the present invention.
Figure 14B:
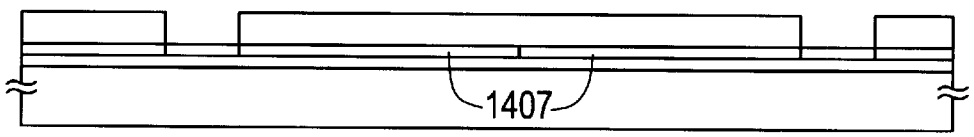

Next, the silicon oxide film 1404 was patterned to selectively form opening portions 1405. Thereafter, a nickel acetate salt solution containing nickel of 100 ppm in terms of weight was applied. By this, a nickel containing layer 1406 was formed, and the nickel containing layer 1406 was brought into contact with the amorphous silicon film 1402 at only the bottoms of the opening portions 1405 (FIG. 14A).

Next, a heat treatment at 500 to 650° C. for 4 to 24 hours (in this embodiment, at 570° C. for 14 hours) was carried out, so that crystallization of the amorphous silicon film was carried out. In this crystallizing process, a portion with which nickel is in contact is first crystallized, and crystal growth progresses in the direction almost parallel to the substrate. It is crystallographically ascertained that the crystallization progresses in the <111> axis direction.

The thus formed polysilicon film 1407 is made of a collective of rod-like or needle-like crystals, and each rod-like crystal macroscopically grows with certain directionality. Thus, there is an advantage that crystallinity is uniform.

In the foregoing two techniques, instead of nickel (Ni), an element such as germanium (Ge), iron (Fe), palladium (Pd), tin (Sn), lead (Pb), cobalt (Co), platinum (Pt), copper (Cu), or gold (Au) may be used.

A crystalline semiconductor film (including a crystalline silicon film and a crystalline silicon germanium film) is formed by using the technique as described above, and patterning is carried out to form an active layer. Subsequent steps may comply with the embodiment 3.

In the case where a TFT is fabricated using the crystalline semiconductor film which was crystallized by use of the technique of this embodiment, although high field effect mobility (mobility) can be obtained, high reliability has been required because of that. However, when the TFT structure of the present invention is adopted, it becomes possible to fabricate a TFT which utilizes the technique of this embodiment to the utmost.

Embodiment 5

In this embodiment, a description will be made on an example in which after a polysilicon film is formed using a catalytic element (nickel is used as an example) as in the embodiment 4, a step of removing nickel remaining in the film is carried out. As a technique of removing nickel, this embodiment uses a technique disclosed in Japanese Patent Unexamined Publication No. Hei. 10-270363 or No. Hei. 10-247735.

The technique disclosed in Japanese Patent Unexamined Publication No. Hei. 10-270363 is such that nickel used for crystallization of a semiconductor is removed after crystallization by using a gettering function of an element in group 15 (typically, phosphorus). By using the technique, it is possible to reduce a concentration of nickel in an active layer to $1\times10^{17}$ atoms/cm$^3$ or less (preferably $1\times10^{16}$ atms/cm$^3$ or less).

Figure 15A:
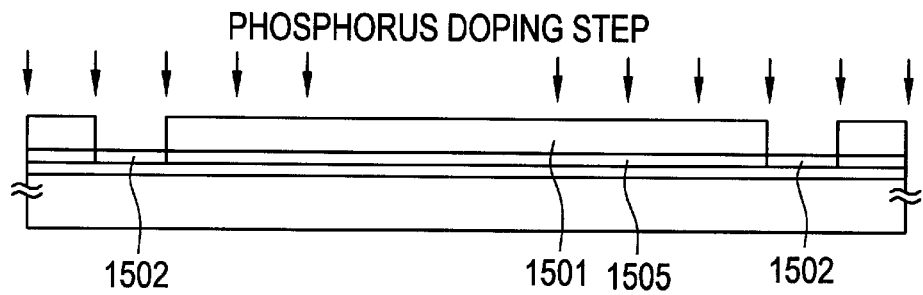
FIGS. 15A and 15B are views showing an example of fabricating steps of an active matrix type semiconductor display device of the present invention.
Figure 15B:
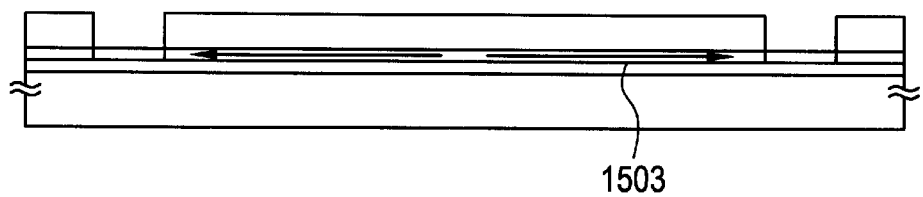

Here, a case where the technique is applied to the present invention will be shown in FIGS. 15A and 15B. First, a polysilicon film 1505 was formed in accordance with the steps of the embodiment 4. Next, a mask insulating film 1501 having an opening portion was provided, and phosphorus was added in that state. At this time, a region 1502 where phosphorus was added at a high concentration was formed in the polysilicon film exposed at the opening portion. The present applicant refers to this region as a gettering region (FIG. 15A).

Phosphorus is added in the gettering region 1502 at a concentration of $1\times10^{19}$ to $1\times10^{21}$ atms/cm$^3$ (typically $1\times10^{20}$ atms/cm$^3$).

Next, a heat treatment was carried out at 550 to 650° C. for 4 to 15 hours (in this embodiment, at 600° C. for 12 hours). By this heat treatment, the catalytic element (in this embodiment, nickel) remaining in the polysilicon film 1505 moved in a direction of an arrow, and was gettered in the gettering region 1502. That is the reason why the region 1502 is called a gettering region. The concentration of nickel contained in a polysilicon film 1503 formed in this way was reduced to $1\times10^{17}$ atms/cm$^3$ or less.

The technique disclosed in Japanese Patent Unexamined Publication No. Hei. 10-247735 is a technique characterized in that after crystallization is made by using the technique disclosed in Japanese Patent Unexamined Publication No. Hei. 7-135318, a mask used for selective addition of a catalytic element is directly used as a mask for phosphorus addition. This technique is very effective in improvement of throughput.

A crystalline semiconductor film (including a polysilicon film and a polysilicon germanium film) is formed by using this embodiment made of the technique as described above and patterning may be carried out to form an active layer. Subsequent steps may comply with the embodiment 3.

Embodiment 6

In this embodiment, a description will be made on an example in which after a polysilicon film is formed using a catalytic element (nickel is used as an example) as described in the embodiment 4, a step of removing nickel is carried out. As a technique of removing nickel, this embodiment uses a technique disclosed in Japanese Patent Unexamined Publication No. Hei. 10-135468 or No. Hei. 10-135469.

The technique disclosed in the publication is such that nickel used for crystallization of a semiconductor is removed by using a gettering function of a halogen element (typically chlorine) after crystallization. By using the technique, it is possible to reduce a concentration of nickel in an active layer to $1\times10^{17}$ atms/cm$^3$ or less (preferably $1\times10^{16}$ atms/cm$^3$ or less).

Figure 16A:
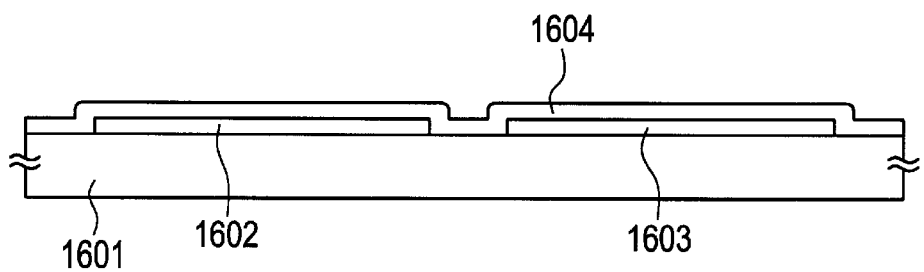
FIGS. 16A and 16B are views showing an example of fabricating steps of an active matrix type semiconductor display device of the present invention.
Figure 16B:
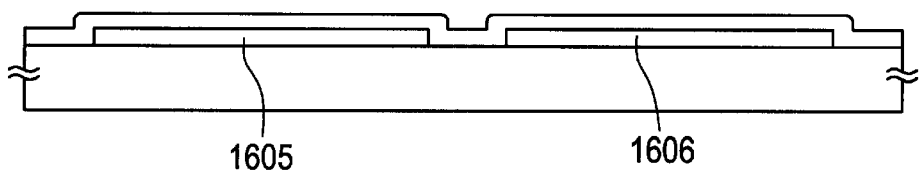

A structure of this embodiment will be described with reference to FIGS. 16A and 16B. First, a quartz substrate 1601 having high heat resistance was used as a substrate. Of course, a silicon substrate or a ceramic substrate may be used. In the case where the quartz substrate is used, even if a silicon oxide film is not particularly provided as an under film, pollution from the substrate side does not occur.

Next, a polysilicon film (not shown) was formed by using the means of the embodiment 4, and patterning was carried out to form active layers 1602 and 1603. Further, a gate insulating film 1604 made of a silicon oxide film was formed to cover those active layers (FIG. 16A).

After the gate insulating film 1604 was formed, a heat treatment was carried out in an atmosphere containing a halogen element. In this embodiment, an atmosphere was made an oxidizing atmosphere in which oxygen and hydrogen chloride were mixed, a processing temperature was made 950° C., and a processing time was made 30 minutes. Incidentally, it is sufficient if the processing temperature is selected between 700 to 1100° C., and the processing time is selected between 10 minutes to 8 hours (FIG. 16B).

At this time, nickel becomes volatile nickel chloride and goes out into the processing atmosphere, so that the concentration of nickel in the polysilicon film is reduced. Thus, the concentration of nickel contained in the active layers 1605 and 1606 shown in FIG. 16B was reduced to $1 \times 10^{17}$ atms/cm$^3$ or less.

The active layers are formed by using this embodiment made of the technique as described above, and the subsequent steps may comply with the embodiment 3.

Embodiment 7

In this embodiment, a description will be made on an example of a fabricating method of an active matrix type liquid crystal display device described in the foregoing embodiment 1 and the embodiment 2, which is different from the fabricating method of the embodiment 3.

Reference will be made on FIGS. 17A to 17E and FIGS. 18A and 18B. First, as a substrate 1701, an alkali-free glass substrate typified by, for example, a substrate of 1737 glass made by Corning Inc. was used. An under film 1702 made of silicon oxide and having a thickness of 200 nm was formed on the surface of the substrate 1701 on which TFTs were to be formed. As the under film 1702, a silicon nitride film may be further laminated, or only a silicon nitride film may be used.

Next, an amorphous silicon film having a thickness of 50 nm was formed on the under film 1702 by a plasma CVD method. Although depending on the hydrogen content of the amorphous silicon film, the film was preferably heated to 400 to 500° C. to carry out a dehydrogenating process so that the hydrogen content of the amorphous silicon film was made 5 atm % or less, and a step of crystallization was carried out to form a crystalline silicon film.

A well-known laser crystallizing technique or thermal crystallizing technique may be used for the step of crystallization. In this embodiment, a beam of a pulse oscillation type KrF excimer laser was concentrated into a linear shape and was irradiated to the amorphous silicon film, so that a crystalline silicon film was formed. Incidentally, the method described in the foregoing embodiment 5 or embodiment 6 may be used for this step of crystallization.

Incidentally, although the amorphous silicon film was used as the initial film in this embodiment, a microcrystalline silicon film may be used as an initial film, or a crystalline silicon film may be directly used.

The thus formed crystalline silicon film was patterned to form island-like semiconductor layers 1703, 1704, and 1705.

Next, a gate insulating film 1706 containing silicon oxide or silicon nitride as its main ingredient was formed to cover the semiconductor layers 1703, 1704, and 1705. Here, a silicon nitride oxide film (silicon oxynitride film) having a thickness of 100 nm was formed by a plasma CVD method. Although not described in FIGS. 17A to 17E, first gate electrodes are formed on the surface of the gate insulating film 1706. A tantalum (Ta) film having a thickness of 10 to 200 nm, for example, 50 nm was formed as a first conductive film, and an aluminum (Al) film having a thickness of 100 to 1000 nm, for example, 200 nm was formed as a second conductive film by a sputtering method. Then, first conductive films 1707, 1708, 1709, and 1710 and second conductive films 1712, 1713, 1714, and 1715 constituting the first gate electrodes were formed by a well-known patterning technique.

In the case where aluminum is used for the second conductive film constituting the first gate electrode, pure aluminum may be used, or an aluminum alloy containing 0.1 to 5 atm % of an element selected from the group consisting of titanium, silicon, and scandium may be used. In the case where copper is used, although not shown, it is preferable that a silicon nitride film is provided on the surface of the gate insulating film 1706.

In FIGS. 17A to 17E, such a structure is made that an additional capacitance portion is provided at a drain side of an n-channel TFT constituting a pixel matrix circuit. At this time, wiring line electrodes 1711 and 1716 of the additional capacitance portion are formed of the same material as the first gate electrode.

Figure 17A:
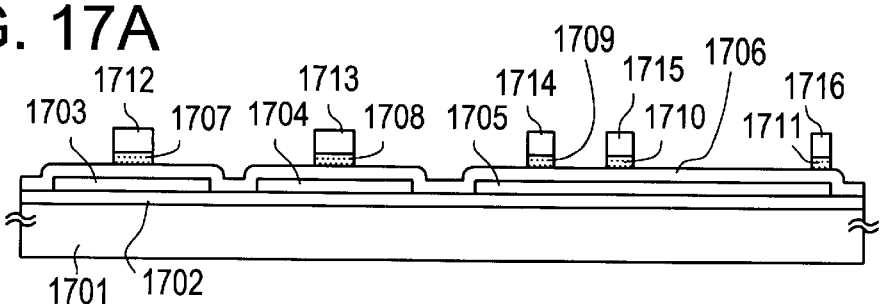
FIGS. 17A to 17E are views showing an example of fabricating steps of an active matrix type semiconductor display device of the present invention.

After the structure shown in FIG. 17A was formed, a first step of adding an n-type impurity was carried out. Phosphorus (P), arsenic (As), antimony (Sb), etc. are known as an impurity to give an n-type to a crystalline semiconductor material. Here, phosphorus was used and an ion doping method using phosphine (PH$_3$) was carried out. In this step, for the purpose of adding phosphorus through the gate insulating film 1706 into the semiconductor layer under the film, an acceleration voltage was set as high as 80 KeV. Also, impurity regions formed in this way are for forming first impurity regions 1734 and 1742 of n-channel TFTs shown later, and function as LDD regions. Thus, it is preferable that a concentration of phosphorus in this region is made within the range of $1 \times 10^{16}$ to $1 \times 10^{19}$ atms/cm$^3$, and here, it was made $1 \times 10^{18}$ atms/cm$^3$.

It was necessary to activate the impurity added in the semiconductor layer by a laser annealing method or heat treatment. Although this step may be carried out after the step of impurity addition for forming source/drain regions, it was effective to activate the impurity by the laser annealing method at this stage.

Figure 17B:
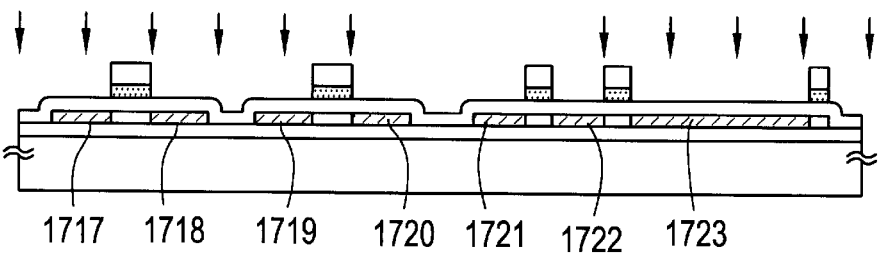

In this step, the first conductive films 1707, 1708, 1709, and 1710 and the second conductive films 1712, 1713, 1714, and 1715, which constituted the first gate electrodes, functioned as masks against addition of phosphorus. As a result, phosphorus was not added at all or was hardly added in regions of the semiconductor layer existing just under the first gate electrodes through the gate insulating film. As shown in FIG. 17B, low concentration impurity regions 1717, 1718, 1719, 1720, 1721, 1722, and 1723 added with phosphorus were formed.

Figure 17C:
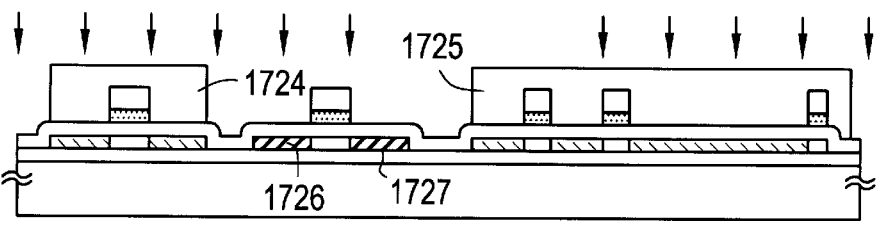

Next, using a photoresist film as a mask, regions where the n-channel TFTs were to be formed were covered with resist masks 1724 and 1725, and a step of addition of an impurity to give a p-type was carried out for only a region where a p-channel TFT was to be formed. Although boron (B), aluminum (Al), and gallium (Ga) are known as an impurity element to give a p-type, boron was added here as the impurity element and addition was made by an ion doping method using diborane ($B_2H_6$). Also in this case, an acceleration voltage was made 80 KeV, and boron was added at a concentration of $2\times10^{20}$ atms/cm$^3$. Then, as shown in FIG. 17C, regions 1726 and 1727 where boron was added at a high concentration were formed. This regions become source/drain regions of the p-channel TFT later.

After the resist masks 1724 and 1725 were removed, a step of forming a second gate electrode was carried out. Here, tantalum (Ta) was used for a material of the second gate electrode, and a film was formed to a thickness of 100 to 1000 nm, for example, 200 nm. Patterning was carried out by a well-known technique so that second gate electrodes 1728, 1729, 1730, and 1731 were formed. At this time, patterning was made so that the length of the second gate electrode became 5 μm. As a result, in the second gate electrode, regions being in contact with the gate insulating film and each having a length of 1.5 μm were formed at both sides of the first gate electrode respectively.

Although the additional capacitance portion was provided at the drain side of the n-channel TFT constituting the pixel matrix circuit, an electrode 1732 of this additional capacitance portion was formed at the same time as the second gate electrode.

Then, a second step of adding an impurity to give an n-type was carried out using the second gate electrodes 1728, 1729, 1730 and 1731 as masks. Here, similarly, the step was carried out by the ion doping method using phosphine ($PH_3$). Also in this step, for the purpose of adding phosphorus through the gate insulating film 1706 into the semiconductor layer under the film, an acceleration voltage was set as high as 80 KeV. Since regions where phosphorus was added were made to function as source regions 1735 and 1743 and drain regions 1736 and 1747 in the n-channel TFT, it is preferable that a concentration of phosphorus in this regions is made $1\times10^{19}$ to $1\times10^{21}$ atms/cm$^3$, and here, it was made $1\times10^{20}$ atms/cm$^3$.

Although not shown here, the gate insulating film covering the source regions 1735 and 1743 and the drain regions 1736 and 1747 may be removed to expose the semiconductor layer of the regions, and phosphorus may be directly added. When this step was added, it was possible to reduce the acceleration voltage of the ion doping method to 10 KeV, and it was possible to effectively add phosphorus.

Although phosphorus was also added at the same concentration into a source region 1739 and a drain region 1740 of the p-channel TFT, since boron was added in the previous step at the concentration twice as large as this concentration, the conductivity was not inverted, and there was no problem in the operation of the p-channel TFT.

Since the impurity elements to give the n-type or p-type which were respectively added at its concentration, were not activated and did not effectively function if anything was not made, a step of activation was needed to be carried out. It was possible to carry out this step by a thermal annealing method using an electric heating furnace, the foregoing laser annealing method using the excimer laser, or a rapid thermal annealing method (RTA method) using a halogen lamp.

In the thermal annealing method, a heat treatment at 550° C. for 2 hours was carried out in a nitrogen atmosphere so that activation was made. In this embodiment, although aluminum was used for the second conductive film constituting the first gate electrode, since the first conductive film and the second gate electrode each made of tantalum were formed to cover aluminum, tantalum functioned as a blocking layer so that it was possible to prevent aluminum atoms from diffusing into other regions. In the laser annealing method, activation was made by concentrating the pulse oscillation type KrF excimer laser beam into a linear shape and by carrying out irradiation. When the thermal annealing method was carried out after the laser annealing method was carried out, a more excellent result was obtained. This step had also an effect of annealing a region where its crystallinity was destroyed by ion doping, and it was also possible to improve the crystallinity of the region.

Through the steps up to the above, in the gate electrode, the first gate electrode and the second gate electrode covering the first gate electrode were provided, and in the n-channel TFT, the source region and the drain region were formed at both sides of the second gate electrode. Also, the structure where the first impurity region provided in the semiconductor layer through the gate insulating film overlapped with the region where the second gate electrode was in contact with the gate insulating film, was formed in a self-aligning manner. On the other hand, in the p-channel TFT, although parts of the source region and the drain region were formed to overlap with the second gate electrode, any problem did not occur practically.

Figure 17D:
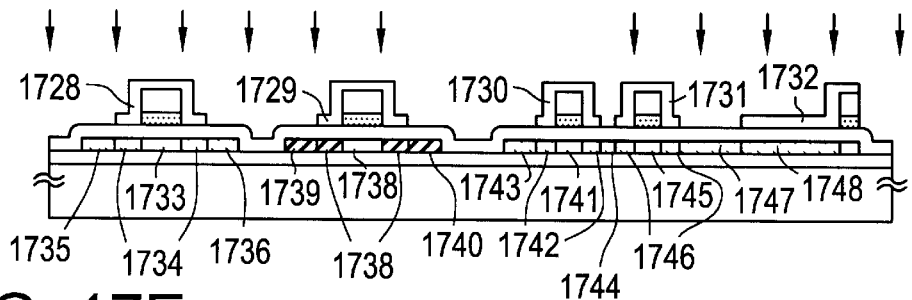

After the state of FIG. 17D was obtained, a first interlayer insulating film 1749 having a thickness of 1000 nm was formed. As the first interlayer insulating film 1749, a silicon oxide film, a silicon nitride film, a silicon nitride oxide film (silicon oxynitride film), an organic resin film, or a laminate film of those may be used. In this embodiment, although not shown, a silicon nitride film having a thickness of 50 nm was first formed, and further a silicon oxide film having a thickness of 950 nm was formed to make a two-layer structure.

Thereafter, the first interlayer insulating film 1749 was patterned so that contact holes were formed for the source region and the drain region of the respective TFTs. Then, source electrodes 1750, 1752, and 1753, and drain electrodes 1751 and 1754 were formed. Although not shown, in this embodiment, the electrodes were formed by patterning a three-layer structure film formed of a titanium film having a thickness of 100 nm, an aluminum film containing titanium and having a thickness of 300 nm, and a titanium film having a thickness of 150 nm which were continuously formed by a sputtering method.

Figure 17E:
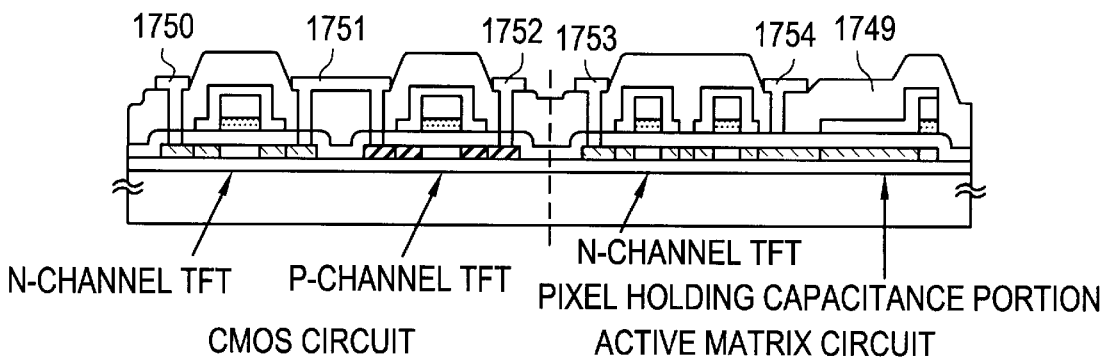

In this way, as shown in FIG. 17E, the CMOS circuit and the active matrix circuit were formed on the substrate 1701. At the same time, the holding capacitance portion was formed at the drain side of the n-channel TFT of the active matrix circuit. The active matrix substrate was fabricated in the manner as described above.

Next, steps of fabricating an active matrix type liquid crystal display device on the basis of the CMOS circuit and the active matrix circuit fabricated on the same substrate through the foregoing steps will be described with reference to FIGS. 18A and 18B. First, to the substrate in the state of FIG. 17E, a passivation film 1755 was formed to cover the source electrodes 1750, 1752, and 1753, the drain electrodes 1751 and 1754, and the first interlayer insulating film 1749. The passivation film 1755 was made of a silicon nitride film having a thickness of 50 nm. Further, a second interlayer insulating film 1756 made of an organic resin was formed to a thickness of about 1000 nm. As the organic resin, polyimide, acryl, polyimideamide, etc. may be used. As advantages obtained by using the organic resin film, it is possible to enumerate such points that a film formation method is simple, parasitic capacitance can be reduced since its relative dielectric constant is low, and flatness is superior. An organic resin film other than the above may be used.

Here, polyimide of such a type that thermal polymerization was made after application to the substrate was used, and was fired at 300° C. to form the film.

Next, a light shielding layer 1757 was formed at a part of the pixel region of the second interlayer insulating film 1756. The light shielding layer 1757 may be formed of a metal film or an organic resin film containing a pigment. Here, a titanium film was formed by a sputtering method.

After the light shielding film 1757 was formed, a third interlayer insulating film 1758 was formed. Similarly to the second interlayer insulating film 1756, it is appropriate that this third interlayer insulating film 1758 is formed by using an organic resin film. A contact hole reaching the drain electrode 1754 was formed in the second interlayer insulating film 1756 and the third interlayer insulating film 1758, and a pixel electrode 1759 was formed. With respect to the pixel electrode 1759, it is appropriate that a transparent conductive film is used in the case where a transmission type liquid crystal display device is formed, and a metal film is used in the case where a reflection type liquid crystal display device is formed. Here, for the purpose of making the transmission type liquid crystal display device, an indium-tin oxide (ITO) film having a thickness of 100 nm was formed by a sputtering method, so that the pixel electrode 1759 was formed.

Figure 18A:
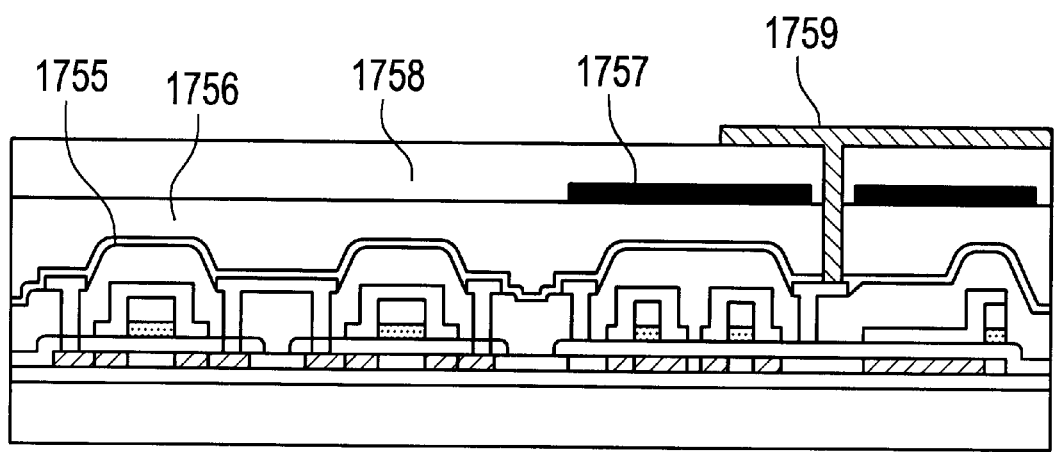
FIGS. 18A and 18B are views showing an example of fabricating steps of an active matrix type semiconductor display device of the present invention.
Figure 18B:
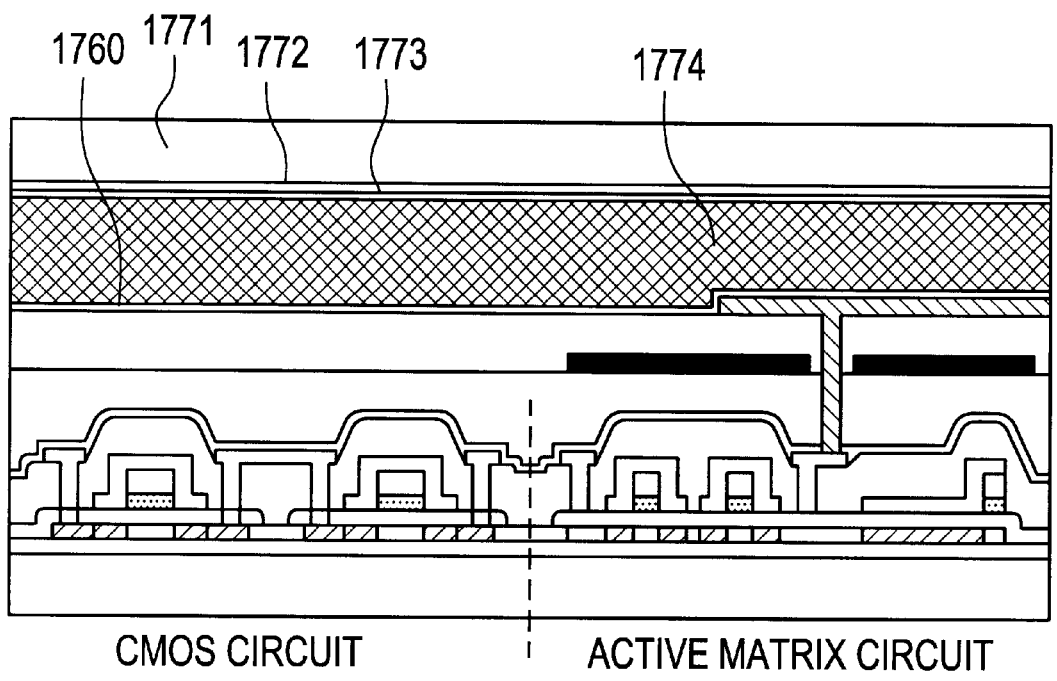

After the state of FIG. 18A was formed, an orientated film 1760 was formed. In general, a polyimide resin is often used for an oriented film of a liquid crystal display device. A counter electrode 1722 and an oriented film 1773 were formed on a substrate 1771 at the opposite side. The oriented film was subjected to a rubbing process after formation so that liquid crystal molecules were made to be parallel oriented with a certain pretilt angle. Incidentally, the counter electrode was processed as described in the embodiment 1 or the embodiment 2.

After the foregoing steps, the substrate on which the active matrix circuit and the CMOS circuit were formed and the counter substrate were bonded to each other by a well-known cell assembling step through a sealing material, a spacer (both are not shown), and the like. Thereafter, a liquid crystal material 1774 was injected between both the substrates, and complete sealing was made by a sealing agent (not shown). Thus, the active matrix type liquid crystal display device shown in FIG. 18B was completed.

Embodiment 8

In the foregoing embodiments 3 to 7, although the active matrix type liquid crystal display device is fabricated using a TFT of a top-gate type, a TFT of a bottom gate type such as a reverse stagger may be used.

Embodiment 9

In the active matrix type liquid crystal display device of the foregoing embodiments 1 to 8, although a TN mode using a nematic liquid crystal as a display medium is used as a display mode, other display modes may be used.

Further, an active matrix type liquid crystal display device may be structured by using a thresholdless antiferroelectric liquid crystal with high response speed or a ferroelectric liquid crystal as a display medium.

For example, it is possible to use a liquid crystal disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless antiferroelectricity in liquid crystals and its application to displays" by S. Inui et al.; or U.S. Pat. No. 5,594,569.

A liquid crystal exhibiting antiferroelectricity in some temperature range is called an antiferroelectric liquid crystal. In mixed liquid crystals including antiferroelectric liquid crystals, there is one called a thresholdless antiferroelectric mixed liquid crystal exhibiting electrooptical response characteristics in which transmittance is continuously changed with respect to an electric field. Some thresholdless antiferroelectric mixed liquid crystal exhibits V-shaped electrooptical response characteristics, and a liquid crystal in which its driving voltage is about ±2.5 V (cell thickness is about 1 $\mu$m to 2 $\mu$m) has also been found.

Figure 21:
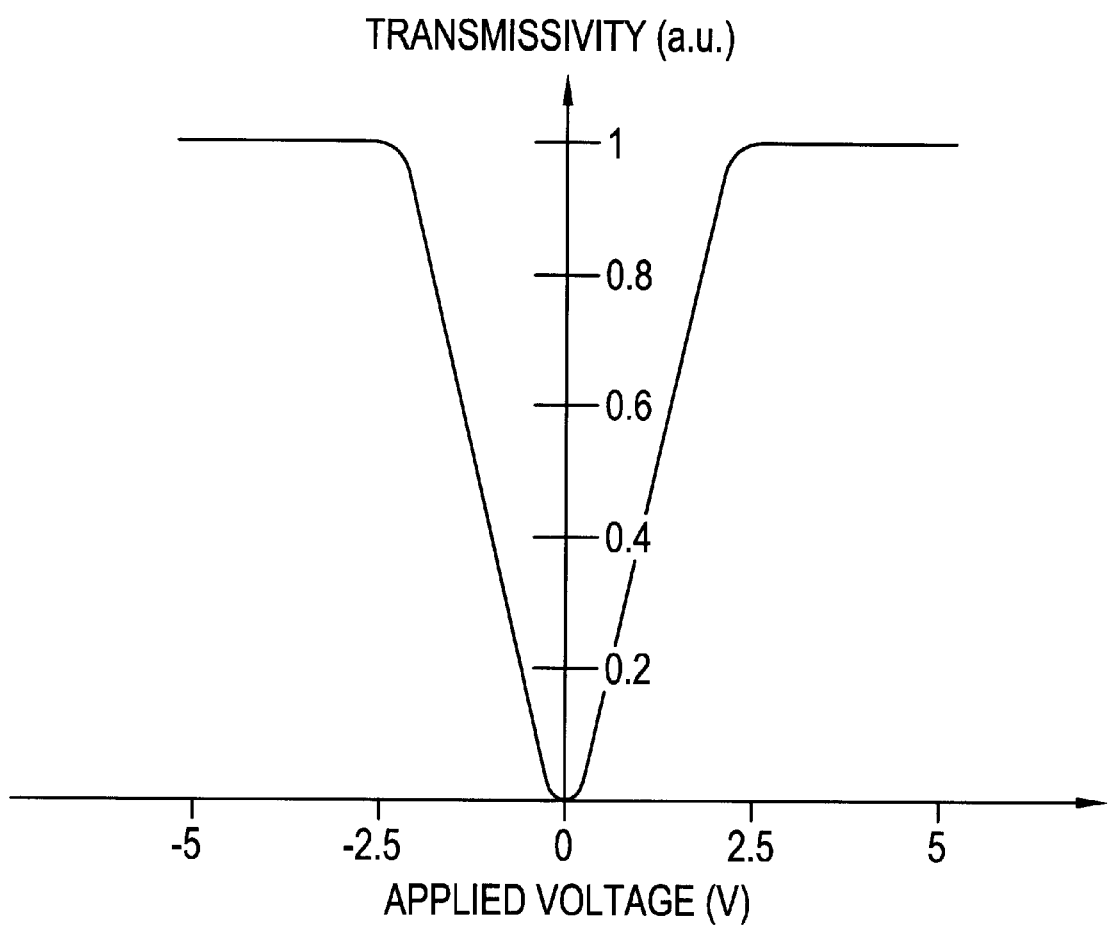
FIG. 21 is a graph showing applied voltage—transmissivity characteristics of a thresholdless antiferroelectric mixed liquid crystal.

Here, FIG. 21 shows an example of characteristics of light transmittance of the thresholdless antiferroelectric mixed liquid crystal showing the V-shaped electrooptical response with respect to applied voltage. The vertical axis of the graph shown in FIG. 21 indicates the transmittance (in an arbitrary unit) and the horizontal axis indicates the applied voltage. Incidentally, the transmission axis of a polarizing plate of an active matrix type liquid crystal display device at an incident side is set almost parallel to a normal direction of a smectic layer of the thresholdless antiferroelectric mixed liquid crystal which is almost coincident with a rubbing direction of the active matrix type liquid crystal display device. The transmission axis of the polarizing plate at an outgoing side is set almost normal (crossed Nicols) to the transmission axis of the polarizing plate at the incident side.

As shown in FIG. 21, it is understood that when such a thresholdless antiferroelectric mixed liquid crystal is used, low voltage driving and gradation display become possible.

In the case where such a low voltage driven thresholdless antiferroelectric mixed liquid crystal is used for an active matrix type liquid crystal display device having an analog driver, it becomes possible to suppress a source voltage of a sampling circuit of an image signal to, for example, about 5 V to 8 V. Thus, the operation power source voltage of the driver can be lowered, and low power consumption and high reliability of the active matrix type liquid crystal display device can be realized.

Also in the case where such a low voltage driven thresholdless antiferroelectric mixed liquid crystal is used for an active matrix type liquid crystal display device having a digital driver, an output voltage of a D/A conversion circuit can be lowered, so that the operation power source voltage of the D/A conversion circuit can be lowered and the operation power source voltage of the driver can be made low. Thus, low power consumption and high reliability of the active matrix type liquid crystal display device can be realized.

Thus, to use such a low voltage driven thresholdless antiferroelectric mixed liquid crystal is effective also in the case where a TFT including an LDD region (low concentration impurity region) with a relatively small width (for example, 0 nm to 500 nm or 0 nm to 200 nm) is used.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for an active matrix type liquid crystal display device, it becomes necessary to provide relatively large holding capacitance for a pixel. Thus, it is preferable to use the thresholdless antiferroelectric mixed liquid crystal having small spontaneous polarization. Besides, it is also permissible to design such that a driving method of the active matrix type liquid crystal display device is made linear sequential driving, so that a writing period (pixel feed period) of a gradation voltage to a pixel is prolonged and small holding capacitance is compensated.

Since low voltage driving can be realized by using such a thresholdless antiferroelectric mixed liquid crystal, low power consumption of the active matrix type liquid crystal display device can be realized.

Incidentally, as long as a liquid crystal has electrooptical characteristics as shown in FIG. 21, any liquid crystals can be used as a display medium of an active matrix type liquid crystal display device of the present invention.

Besides, any other display mediums in which its optical characteristics can be modulated in response to an applied voltage may be used for an active matrix type semiconductor display device of the present invention. For example, an electroluminescence element or the like may be used.

Besides, as an active element used for an active matrix circuit of an active matrix type liquid crystal display device, a MIM element or the like may be used instead of a TFT.

Incidentally, in the foregoing embodiments, although the description has been made on examples of the active matrix type liquid crystal display device in which the active matrix circuit and the driver circuit are integrally formed on the same substrate, the active matrix circuit and the driver circuit may be separately formed in the active matrix type semiconductor display device of the present invention. In this case, as a pixel TFT constituting the active matrix circuit, an amorphous silicon TFT can be used, and the driver circuit can be constituted by an IC.

Embodiment 10

In this embodiment, a description will be made on examples of electronic equipments in each of which the foregoing active matrix type semiconductor display device of the embodiments 1 to 9 is incorporated as a part. Incidentally, the active matrix type semiconductor display device of the present invention can be applied to any kinds of electronic equipments as well as electronic equipments described below.

As such an electronic equipment, a video camera, a digital camera, a projector, a projection TV, a head mount display (goggle-type display), a navigation system for vehicles, a personal computer, and a portable information terminal (a mobile computer, a cellular phone, or an electronic book) may be enumerated. Examples of those are shown in FIG. 19A to 19F.

Figure 19A:
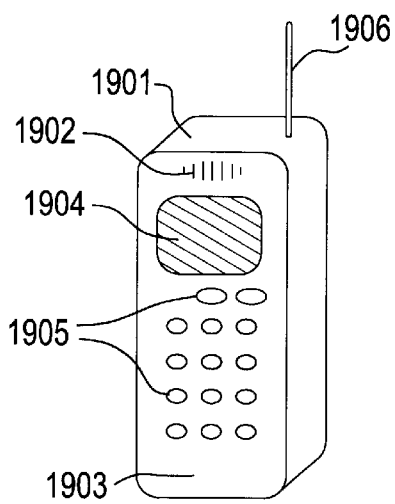
FIGS. 19A to 19F are views showing examples of electronic equipments each including an active matrix type semiconductor display device of the present invention.

FIG. 19A shows a cellular phone comprising a main body 1901, a voice output unit 1902, a voice input unit 1903, an active matrix type semiconductor display device 1904, an operation switch 1905 and an antenna 1906.

Figure 19B:
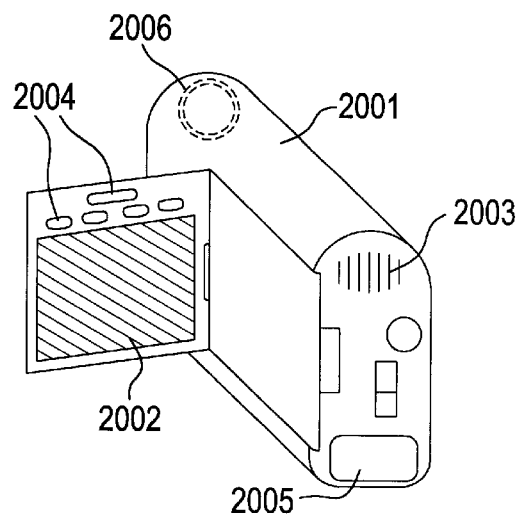

FIG. 19B shows a video camera comprising a main body 2001, an active matrix type semiconductor display device 2002, a voice input unit 2003, an operation switch 2004, a battery 2005, and an image receiving unit 2006.

Figure 19C:
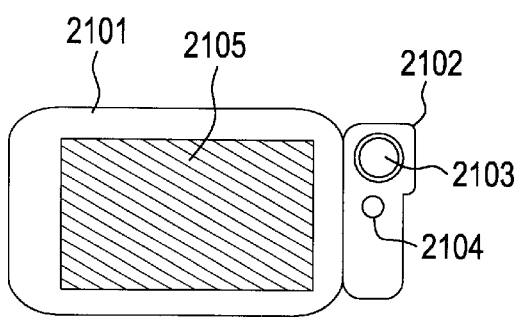

FIG. 19C shows a mobile computer comprising a main body 2101, a camera unit 2102, an image receiving unit 2103, an operation switch 2104, and an active matrix type semiconductor display device 2105.

Figure 19D:
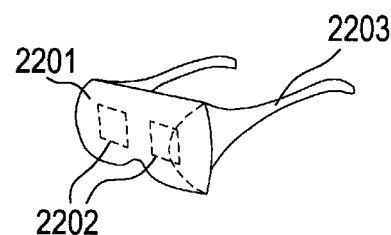

FIG. 19D shows a goggle-type display comprising a main body 2201, an active matrix type semiconductor display device 2202 and an arm portion 2203.

Figure 19E:
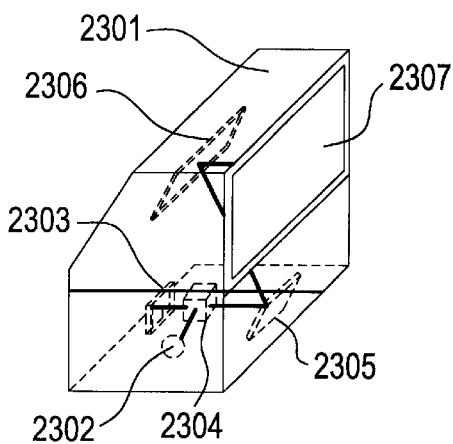

FIG. 19E shows a rear-type projector comprising a main body 2301, an optical source 2302, an active matrix type semiconductor display device 2303, a polar beam splitter 2304, reflectors 2305 and 2306 and a screen 2307.

Figure 19F:
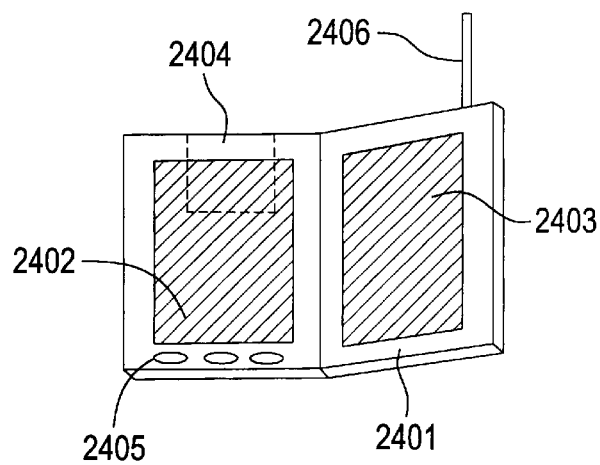
Figure 20:
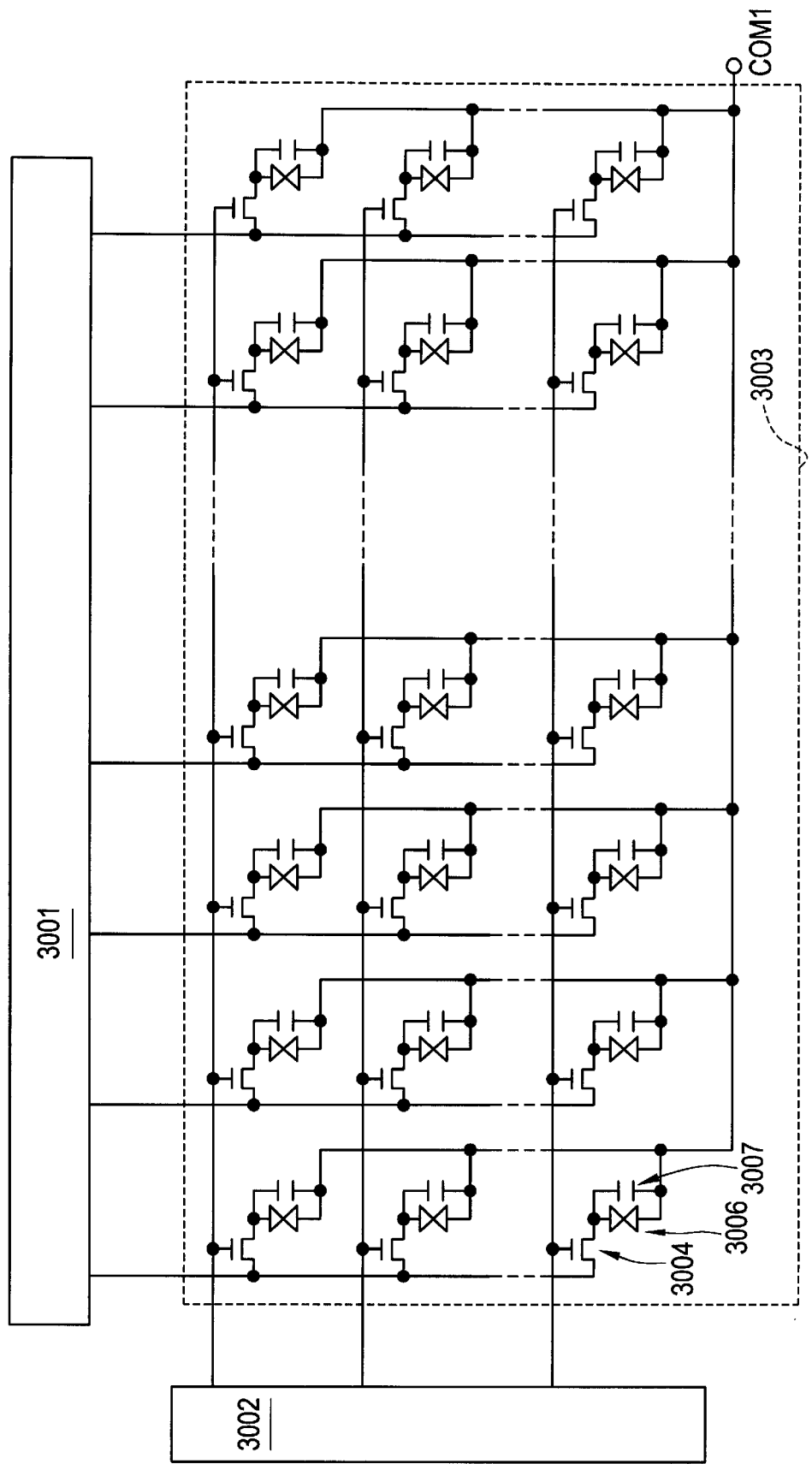
FIG. 20 is a schematic structural view of a conventional active matrix type liquid crystal display device.

FIG. 19F shows a portable book (an electronic book) comprising a main body 2401, active matrix type semiconductor display devices 2402 and 2403, a storing medium 2404, an operation switch 2405 and an antenna 2406.

As described above, the scope of application of the active matrix type semiconductor display device of the present invention is very wide, and the invention can be applied to electronic equipments of any fields.

Embodiment 11

An active matrix type liquid crystal display device of this embodiment is different from the embodiment 2 in the shape of a counter electrode. However, other structures are the same as the embodiment 2.

Figure 22:
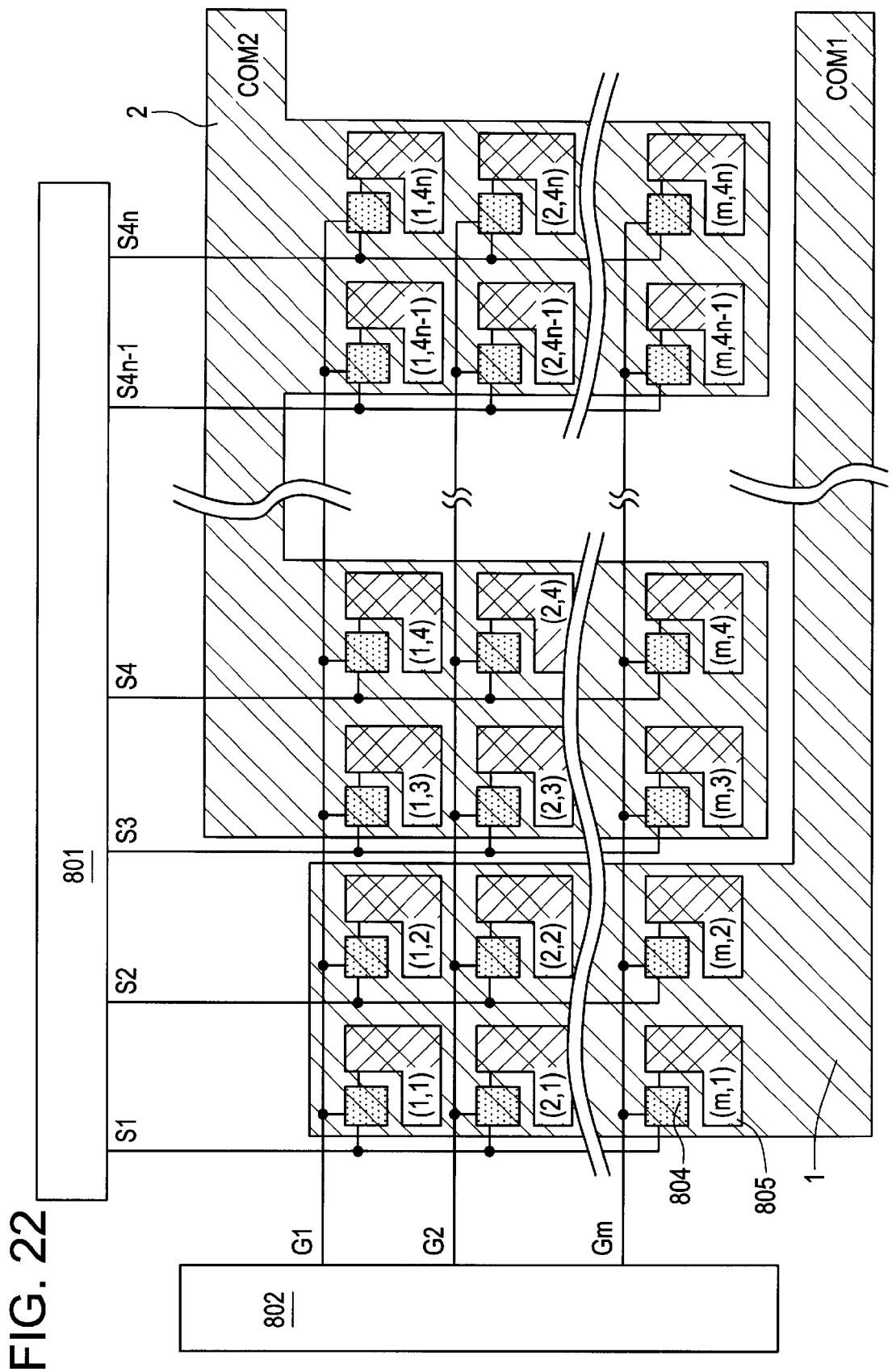
FIG. 22 is a schematic structural view of an active matrix type semiconductor display device of an embodiment of the present invention.

Reference will be made to FIG. 22. FIG. 22 is a schematic structural view of an active matrix type liquid crystal display device of this embodiment. A portion of an active matrix circuit is schematically shown. In FIG. 22, reference numeral 801 designates a source signal line driver circuit; 802, gate signal line driver circuit; 804, a pixel TFT; and 805, a pixel electrode.

In this embodiment, a counter electrode 1 and a counter electrode 2 respectively correspond to two source signal lines at every four source signal lines and have such shape as to mutually fill gaps.

That is, the counter electrode 1 is disposed correspondingly to each of pixels including pixel TFTs (1, 1) to (m, 1), (1, 2) to (m, 2), (1, 5) to (m, 5), (1, 6) to (m, 6), ..., (1, 4n−3) to (m, 4n−3), (1, 4n−2) to (m, 4n−2) connected to source signal lines (S1, S2, S5, S6, ..., S4n−3, S4n−2). However, for example, the counter electrode disposed correspondingly to the pixels including the pixel TFTs (1, 1) to (m, 1) and (1, 2) to (m, 2) has no gap, which is different from the embodiment 2.

The counter electrode 2 is disposed correspondingly to each of pixels including pixel TFTs (1, 3) to (m, 3), (1, 4) to (m, 4), (1, 7) to (m, 7), (1, 8) to (m, 8), ..., (1, 4n−1) to (m, 4n−1), (1, 4n) to (m, 4n) connected to source signal lines (S3, S4, S7, S8, ..., S4n−1, S4n). However, for example, the counter electrode disposed correspondingly to the pixels including the pixel TFTs (1, 3) to (m, 3) and (1, 4) to (m, 4) has no gap, which is different from the embodiment 2.

Embodiment 12

In this embodiment, a structure of a counter electrode is different from other embodiments. However, other structures are the same as the embodiment 1.

Figure 23:
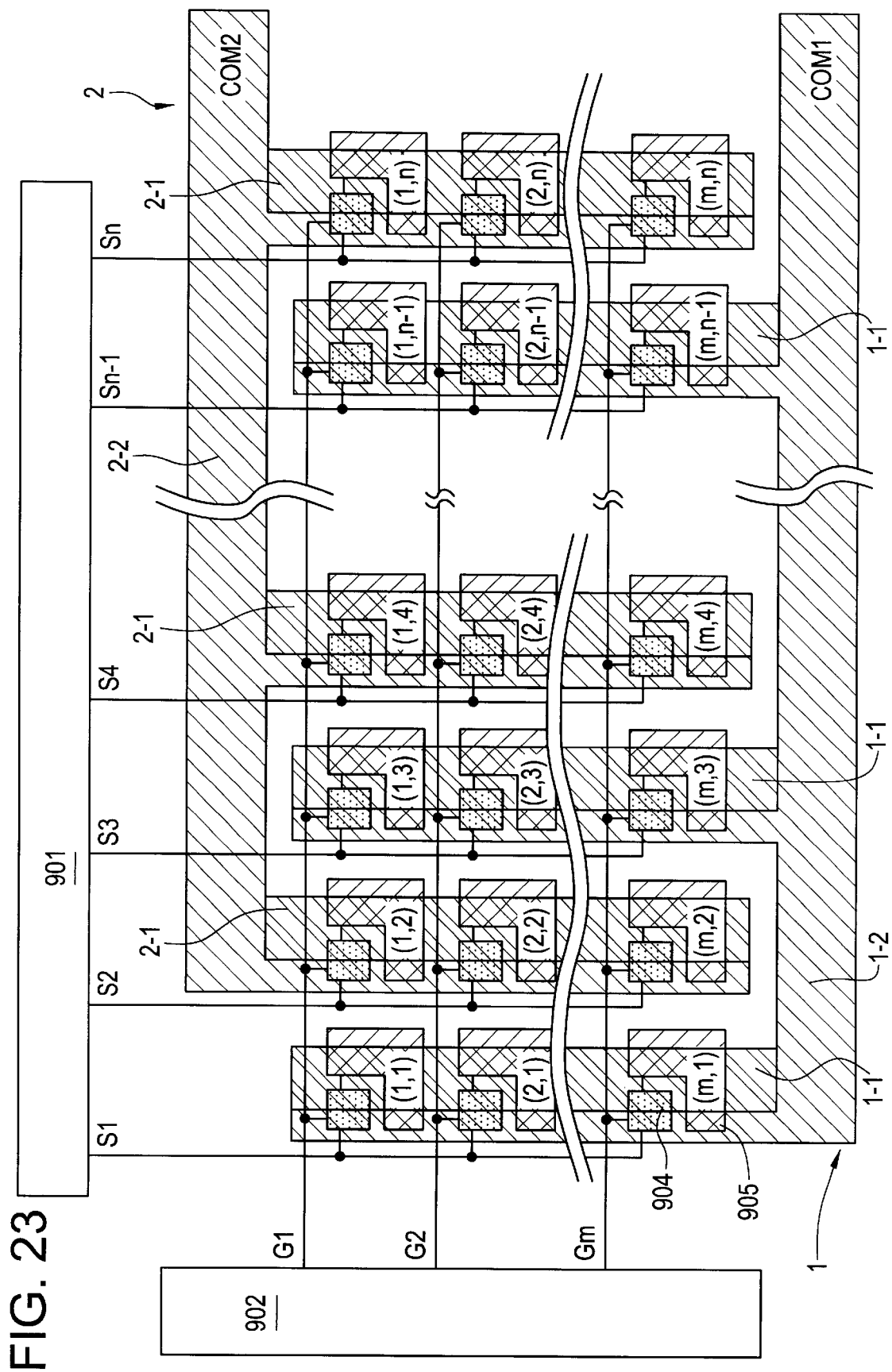
FIG. 23 is a schematic structural view of an active matrix type semiconductor display device of an embodiment of the present invention.

Reference will be made to FIG. 23. FIG. 23 schematically shows a portion of the active matrix circuit in the schematic structural view of the active matrix type liquid crystal display device of this embodiment. In FIG. 23, reference numeral 901 designates a source signal line driver circuit; 902, gate signal line driver circuit; 904, a pixel TFT; and 905, a pixel electrode.

In this embodiment, a counter electrode 1 is constituted by a counter electrode 1-1 made of translucent conductive material and a counter electrode 1-2 made of low resistance metal material. This counter electrode 1-2 is formed above the pixel TFT 904 and functions as a light shielding film. As a material of the counter electrode 1-2, for example, Ti or the like can be used.

The counter electrode 2 also adopts a structure similar to the counter electrode 1, and is constituted by a counter electrode 2-1 made of translucent conductive material and a counter electrode 2-2 made of low resistance metal material.

By adopting the structure as in this embodiment, the resistance of the counter electrode 1 and the counter electrode 2 can be made low.

Embodiment 13

In this embodiment, a structure of a counter electrode is different from the embodiment 12. However, other structures are the same as the embodiment 1.

Figure 24:
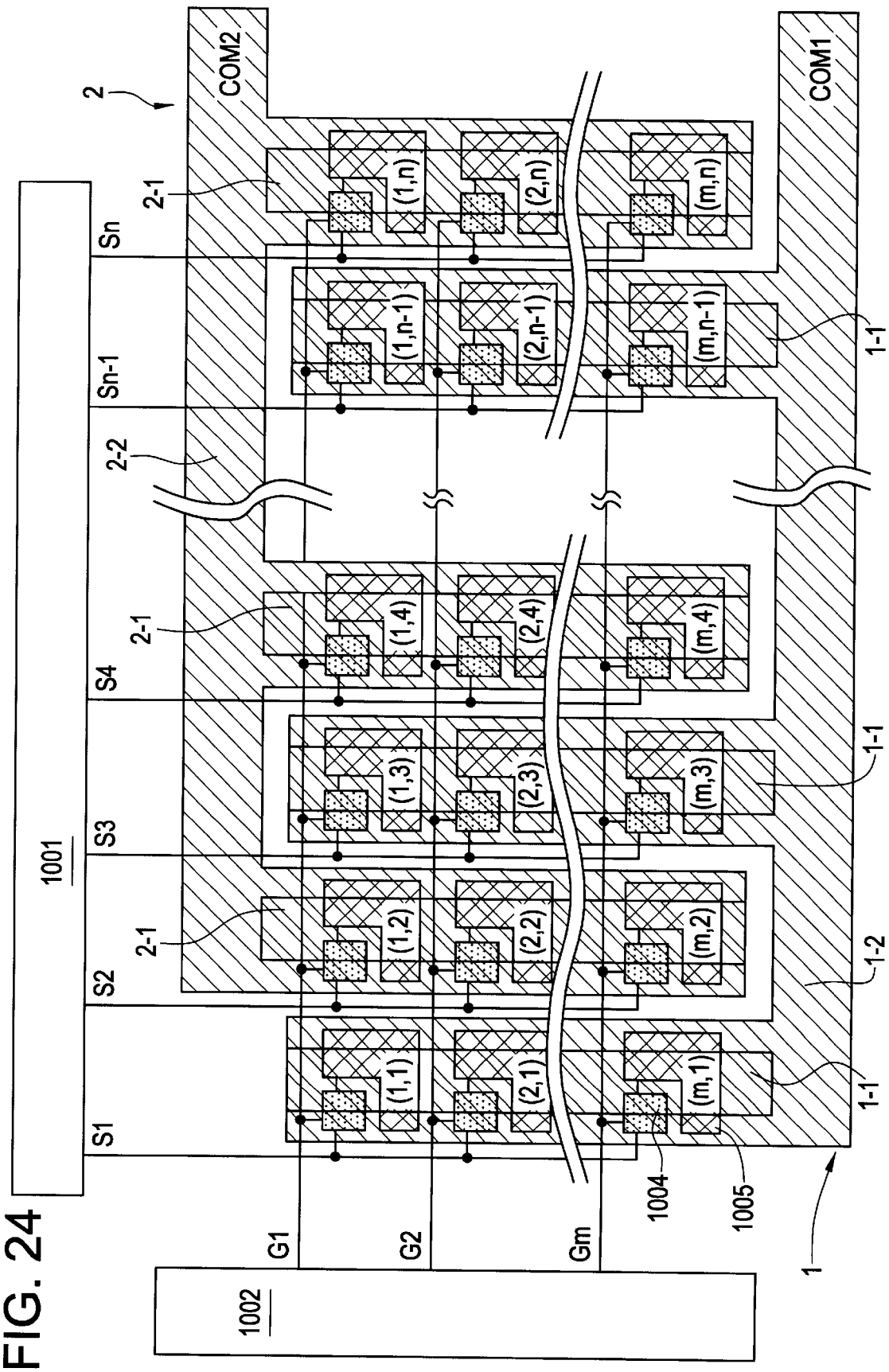
FIG. 24 is a schematic structural view of an active matrix type semiconductor display device of an embodiment of the present invention.

Reference will be made to FIG. 24. FIG. 24 schematically shows a portion of the active matrix circuit in the schematic structural view of the active matrix type liquid crystal display device of this embodiment. In FIG. 24, reference numeral 1001 designates a source signal line driver circuit; 1002, a gate signal line driver circuit; 1004, a pixel TFT; and 1005, a pixel electrode.

A counter electrode 1 and a counter electrode 2 of this embodiment are different from a counter electrode 1 and a counter electrode 2 of the embodiment 12 in the shape of a counter electrode 1-2 functioning as a light shielding film and a counter electrode 2-2. The counter electrode 1 has such a structure that at a place above a pixel, the counter electrode 1-1 made of translucent conductive material is sandwiched between the counter electrodes 1-2 made of low resistance metal material. As a material of the counter electrode 1-2, for example, Ti or the like can be used.

The counter electrode 2 also adopts a structure similar to the counter electrode 1.

By adopting the structure as in this embodiment, the resistance of the counter electrode 1 and the counter electrode 2 can be made lower than the embodiment 12.

The present invention has the following effects.

In the active matrix type semiconductor display device of the present invention, a counter electrode is divided into two, different potentials are applied to the two counter electrodes, respectively, and inversion driving is carried out each other. Since a potential of an image signal can be made low by doing so, it is possible to lower a voltage necessary for operation of a driver circuit.

As a result, it is possible to realize improvement of reliability of an element such as TFT constituting the driver circuit and an active matrix circuit, and reduction of consumed electric power.

Moreover, since it is possible to lower a voltage of a timing pulse supplied by the driver circuit, a booster circuit can be omitted, and reduction of an area of the driver circuit can be realized.

In the active matrix type semiconductor display device of the present invention, an addressing mode such as gate line (row) inversion driving, source line (column) inversion driving, or dot (point) inversion driving can be effectively adopted, so that deterioration of a display screen can be prevented.

Embodiment 14

This example demonstrates a process for producing an EL (electroluminescence) display device according to the invention of the present application.

Figure 25A:
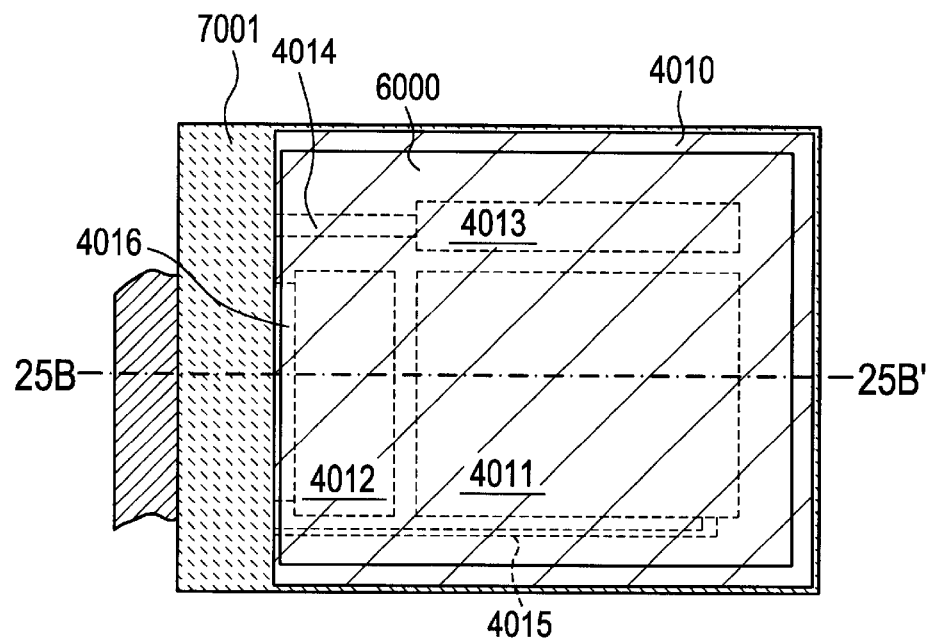
FIG. 25A is a top-view showing the structure of an active matrix EL display device.

FIG. 25A is a top view showing an EL display device, which was produced according to the invention of the present application. In FIG. 25A, there are shown a substrate 4010, a pixel part 4011, a driving circuit from the source 4012, and a driving circuit from the gate 4013, each driving circuit being connected to wirings 4014–4016 which reach FPC 4017 leading to external equipment.

The pixel part, preferably together with the driving circuit, is enclosed by a covering material 6000, a sealing material (or housing material) 7000, and an end-sealing material (or second sealing material) 7001.

Figure 25B:
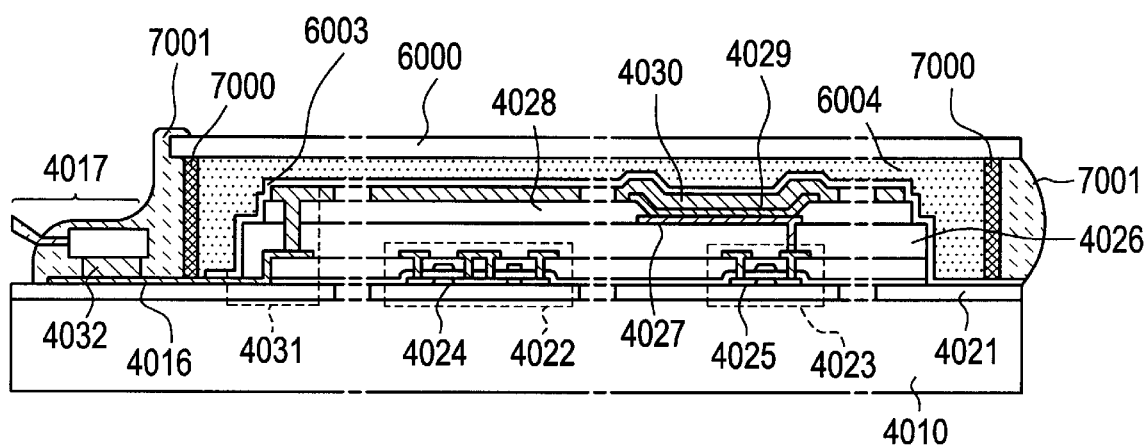
FIG. 25B is a cross-sectional view showing thereof.

FIG. 25B is a sectional view showing the structure of the EL display device in this Example. There is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.) These TFTs may be of any known structure (top gate structure or bottom gate structure).

Upon completion of TFT 4022 (for the driving circuit) and TFT 4023 (for the pixel unit), a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide.

Subsequently, the EL layer 4029 is formed. It may be of single-layer structure or multi-layer structure by freely combining known EL materials such as hole injection layer, hole transport layer, light emitting layer, electron transport layer, and electron injection layer. Any known technology may be available for such structure. The EL material is either a low-molecular material or a high-molecular material (polymer). The former may be formed by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inactive atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the inter-layer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 (second sealing material) is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicone resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use granular spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of $\mu$m sandwiched by a PVF film or a Mylar film.

It is noted that the covering material 6000 should have a light transparency according to a light emitting direction (a light radiation direction) from the EL element.

The wiring 4016 is electrically connected to FPC 4017 through the gap between the sealing material 7000/the end-sealing material 7001, and the substrate 4010. As in the wiring 4016 explained above, other wirings 4014 and 4015 are also electrically connected to FPC 4017 under the sealing material 7000 and the end-sealing material 7001.

Embodiment 15

Figure 26A:
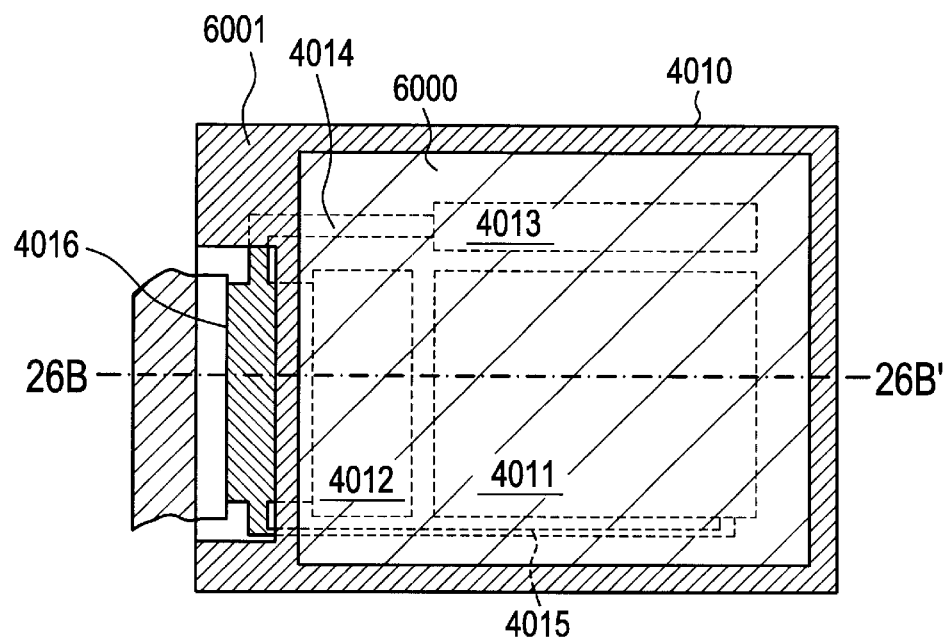
FIG. 26A is a top-view showing the structure of an active matrix EL display device.
Figure 26B:
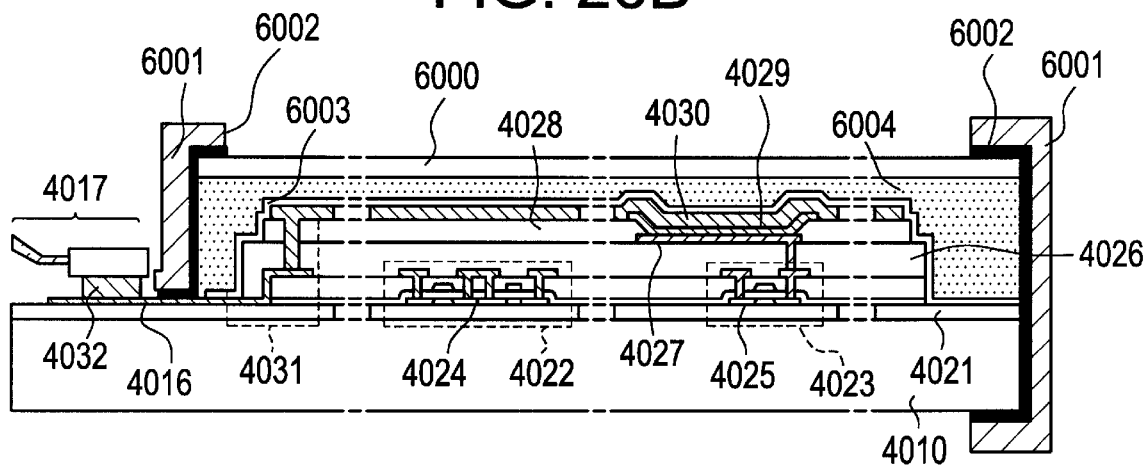
FIG. 26B is a cross-sectional view showing thereof.

In this embodiment, another EL display device having a different structure from the embodiment 14 is explained, as shown in FIGS. 26A and 26B. The same reference numerals in FIGS. 26A and 26B as in FIGS. 25A and 25B indicate same constitutive elements, so an explanation is omitted.

FIG. 26A shows a top view of the EL module in this embodiment and FIG. 26B shows a sectional view of A–A' of FIG. 26A.

According to Embodiment 14, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicone resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use granular spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of $\mu$m sandwiched by a PVF film or a Mylar film.

It is noted that the covering material 6000 should have a light transparency according to a light emitting direction (a light radiation direction) from the EL element.

Next, the covering material 6000 is adhered using the filling material 6004. Then, the frame material 6001 is attached to cover side portions (exposed faces) of the filling material 6004. The frame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

Embodiment 16

Figure 27:
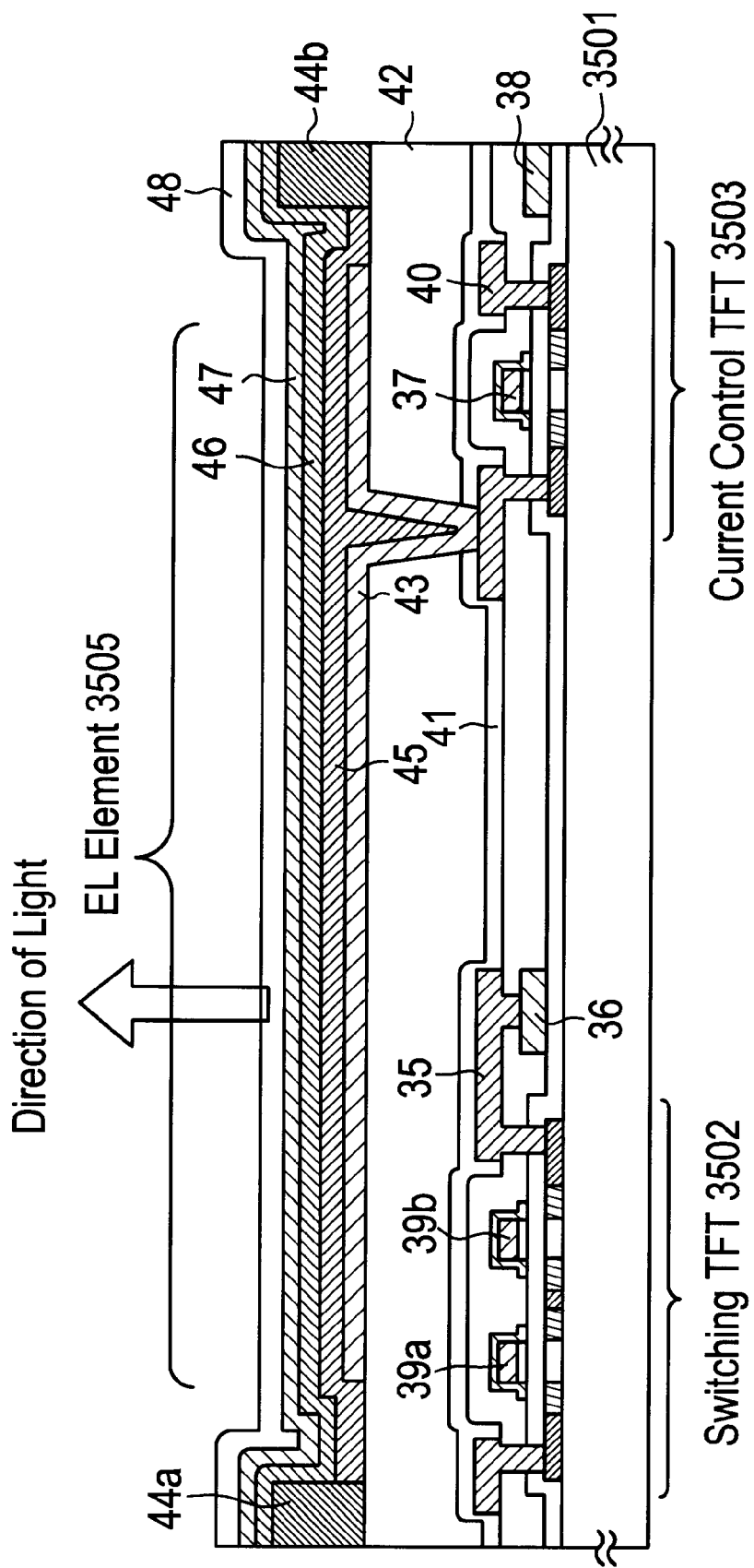
FIG. 27 is a view showing the structure of a pixel portion in an active matrix EL display device.
Figure 28A:
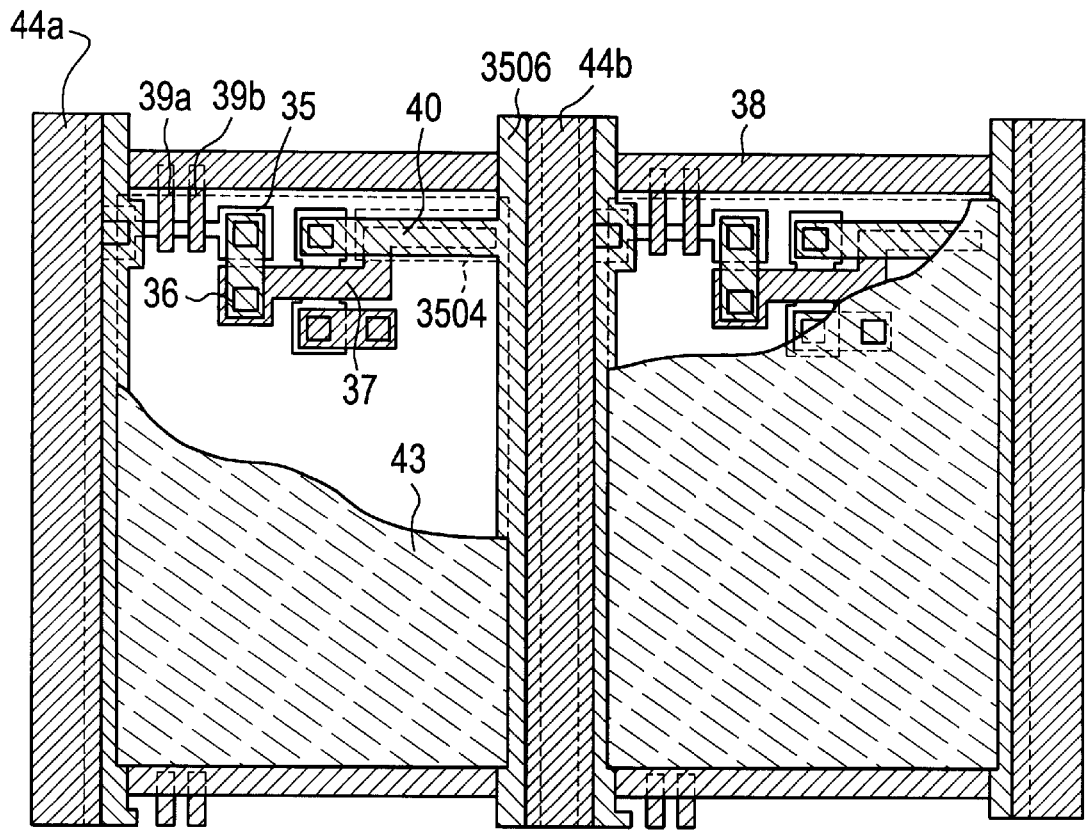
FIG. 28A is a top-view showing the structure of a pixel portion in an active matrix EL display device.
Figure 28B:
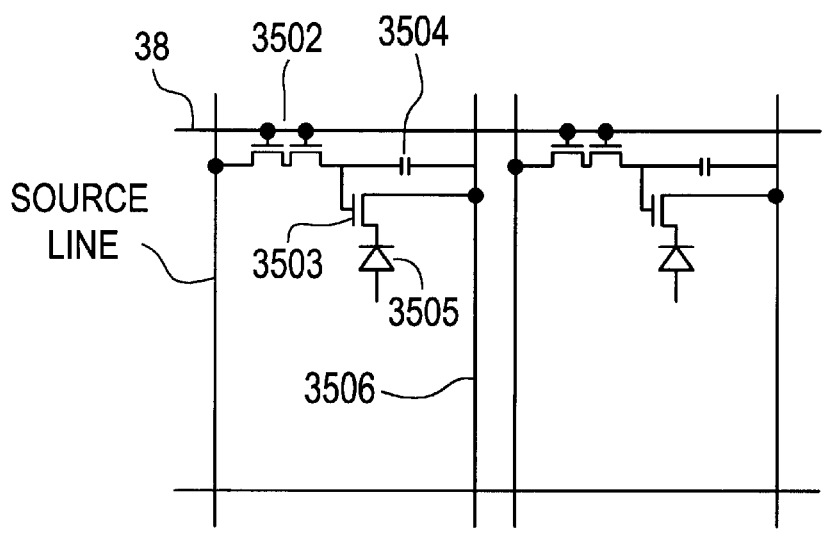
FIG. 28B is a circuit pattern thereof.

In the EL display device having a structure based on the embodiment 14 or 15, the present invention can be used. In this embodiment, the structure of the pixel region in the panel is illustrated in more detail. FIG. 27 shows the cross section of the pixel region; FIG. 28A shows the top view thereof; and FIG. 28B shows the circuit pattern for the pixel region. In FIG. 27, FIG. 28A and FIG. 28B, the same reference numerals are used for the same parts.

In FIG. 27, the switching TFT 3502 formed on the substrate 3501 is NTFT of the invention. In this Embodiment, it has a double-gate structure. The double-gate structure of the switching TFT 3502 has substantially two TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT.

The current-control TFT 3503 is NTFT of the invention. The drain wire 35 in the switching TFT 3502 is electrically connected with the gate electrode 37 in the current-control TFT, via the wire 36 therebetween. The wire indicated by 38 is a gate wire for electrically connecting the gate electrodes 39a and 39b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which a drain region is so constructed that the gate electrode overlaps with an LDD region via a gate-insulating film therebetween.

In this Embodiment, the current-control TFT 3503 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 28A, the wire to be the gate electrode 37 in the current-control TFT 3503 overlaps with the drain wire 40 thereof in the region indicated by 3504, via an insulating film therebetween. In this state, the region indicated by 3504 forms a capacitor. The capacitor 3504 functions to retain the voltage applied to the gate in the current-control TFT 3503. The drain wire 40 is connected with the current supply line (power line) 3506, from which a constant voltage is all the time applied to the drain wire 40.

On the switching TFT 3502 and the current-control TFT 3503, formed is a first passivation film 41. On the film 41, formed is a planarizing film 42 of an insulating resin. It is extremely important that the difference in level of the layered parts in TFT is removed through planarization with the planarizing film 42. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 43 indicates a pixel electrode (a cathode in the EL device) of an electroconductive film with high reflectivity. The pixel electrode 43 is electrically connected with the drain of the current-control TFT 3503. It is preferable that the pixel electrode 43 is of a low-resistance electroconductive film of an aluminum alloy, a copper alloy or a silver alloy, or of a laminate of those films. Needless-to-say, the pixel electrode 43 may have a laminate structure with any other electroconductive films.

In the recess (this corresponds to the pixel) formed between the banks 44a and 44b of an insulating film (preferably of a resin), the light-emitting layer 45 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include poly-paraphenylenevinylene (PPV) materials, polyvinylcarbazole (PVK) materials, polyfluorene materials, etc.

Various types of PPV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 92576/1998. Any of such known materials are usable herein.

Concretely, cyanopolyphenylenevinylenes may be used for red-emitting layers; polyphenylenevinylenes may be for green-emitting layers; and polyphenylenevinylenes or poly-alkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 46 of PEDOT (polythiophene) or PAni (polyaniline) is formed on the light-emitting layer 45 to give a laminate structure for the EL layer. On the hole injection layer 46, formed is an anode 47 of a transparent electroconductive film. In this Embodiment, the light having been emitted by the light-emitting layer 45 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the lightemitting layer and the hole injection layer having poor heat resistance have been formed, it is preferable that the transparent electroconductive film for the anode is of a material capable of being formed into a film at as low as possible temperatures.

When the anode 47 is formed, the EL device 3505 is finished. The EL device 3505 thus fabricated herein indicates a capacitor comprising the pixel electrode (cathode) 43, the light-emitting layer 45, the hole injection layer 46 and the anode 47. As in FIG. 28A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 48 is formed on the anode 47. For the second passivation film 48, preferably used is a silicon nitride film or a silicon oxynitride film. The object of the film 48 is to insulate the EL device from the outward environment. The film 48 has the function of preventing the organic EL material from being degraded through oxidation and has the function of preventing it from degassing. With the second passivation film 48 of that type, the reliability of the EL display device is improved.

As described hereinabove, the EL display panel of the invention fabricated in this Embodiment has a pixel region for the pixel having the constitution as in FIG. 27, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 to 13 in any desired manner. Incorporating the EL display panel of this Embodiment into the electronic appliance of Embodiment 10 as its display part is advantageous.

Embodiment 17

This Embodiment is to demonstrate a modification of the EL display panel of Embodiment 16, in which the EL device 3505 in the pixel region has a reversed structure. For this Embodiment, referred to is FIG. 29. The constitution of the EL display panel of this Embodiment differs from that illustrated in FIG. 27A only in the EL device part and the current-control TFT part. Therefore, the description of the other parts except those different parts is omitted herein.

Figure 29:
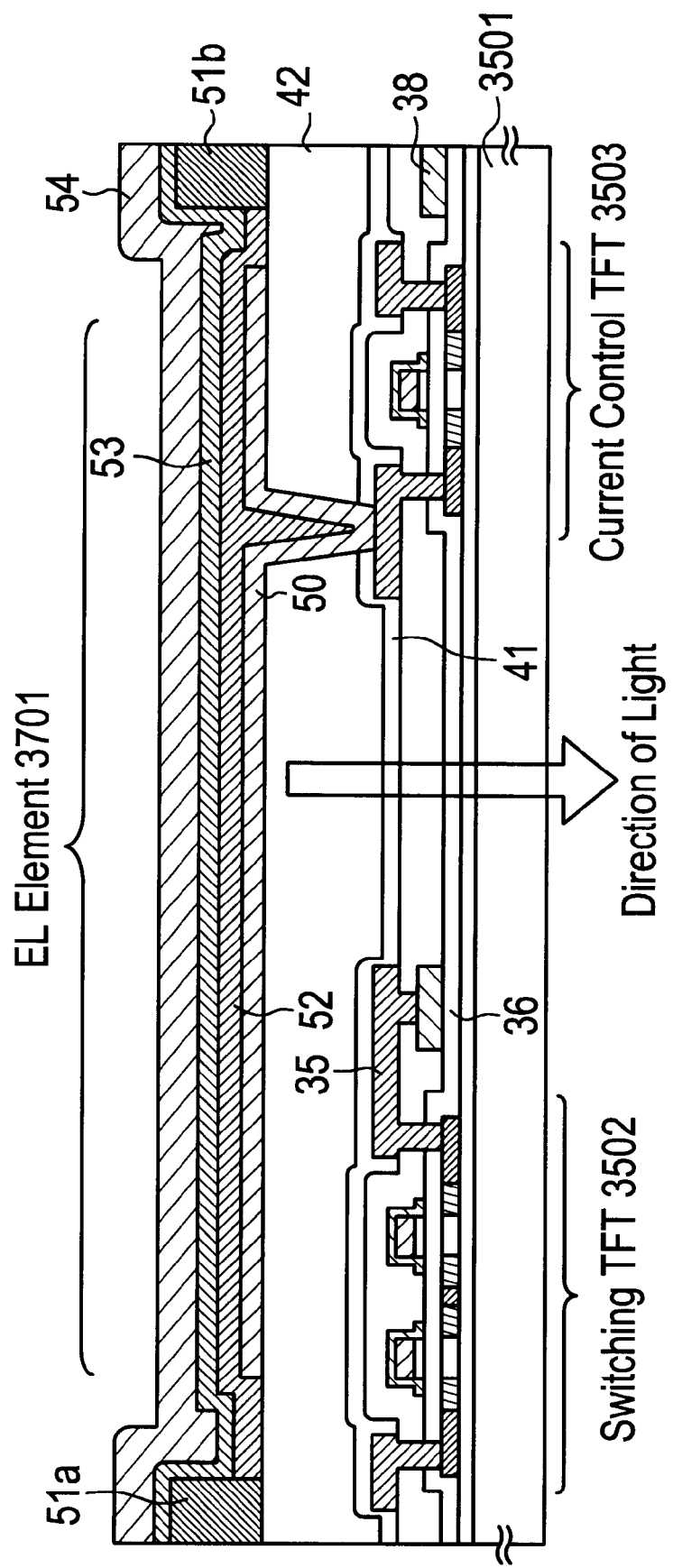
FIG. 29 is a view showing the structure of a pixel portion in an active matrix EL display device.

In FIG. 29, the current-control TFT 3503 may be PTFT.

In this Embodiment, the pixel electrode (anode) 50 is of a transparent electroconductive film. Concretely, used is an electroconductive film of a compound of indium oxide and zinc oxide. Needless-to-say, also usable is an electroconductive film of a compound of indium oxide and tin oxide.

After the banks 51a and 51b of an insulating film have been formed, a light-emitting layer 52 of polyvinylcarbazole is formed between them in a solution coating method. On the light-emitting layer 52, formed are an electron injection layer 53 of acetylacetonatopotassium (hereinafter acacK), and a cathode 54 of an aluminum alloy. In this case, the cathode 54 serves also as a passivation film. Thus is fabricated the EL device 3701.

In this Embodiment, the light having been emitted by the light-emitting layer 52 radiates in the direction toward the substrate with TFT formed thereon, as indicated by the arrow.

The constitution of this Embodiment can be combined with any constitution of Embodiments 1 to 13 in any desired manner. Incorporating the EL display panel of this Embodiment into the electronic appliance of Embodiment 10 as its display part is advantageous.

Embodiment 18

This Embodiment is to demonstrate modifications of the pixel with the circuit pattern of FIG. 28B. The modifications are as in FIGS. 30A to FIG. 30C. In this Embodiment illustrated in those FIGS. 30A to FIG. 30C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 30A:
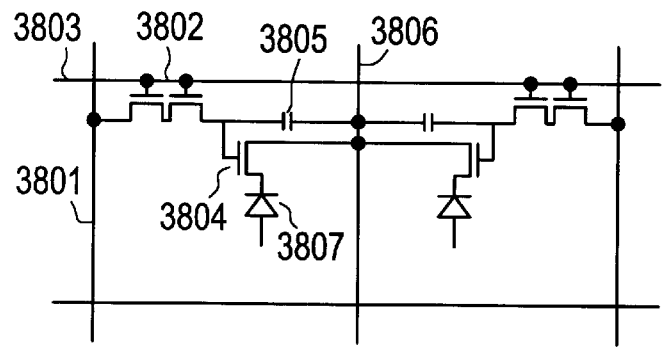
FIGS. 30A to 30C are circuit patterns of a pixel portion in an active matrix EL display device.

In the embodiment of FIG. 30A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel pattern can be much finer and thinner.

Figure 30B:
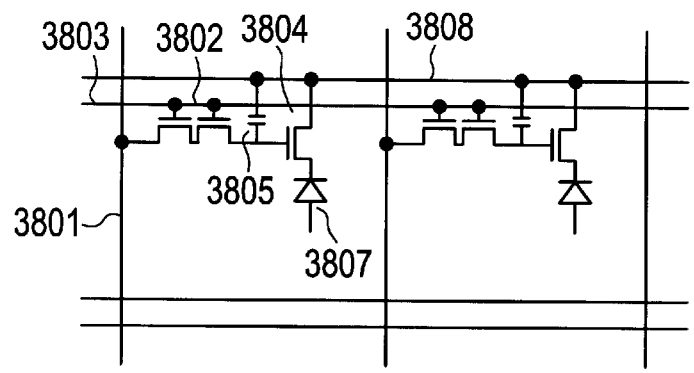

In the embodiment of FIG. 30B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 30C:
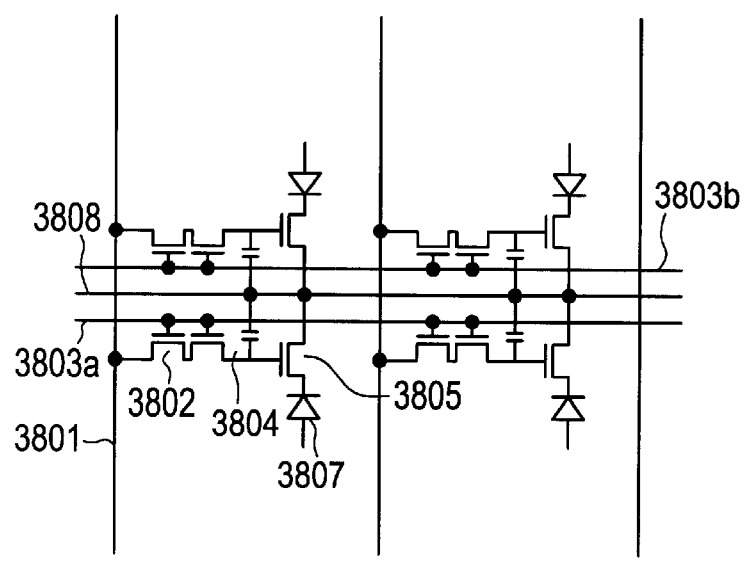

The structure of the embodiment of FIG. 30C is characterized in that the current supply line 3808 is formed in parallel to the gate wires 3803, like in FIG. 30B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiment 1 to 13, 14 and 15 in any desired manner. Incorporating the EL display panel having the pixel structure of this Embodiment into the electronic appliance of Embodiment 10 as its display part is advantageous.

Embodiment 19

The Embodiment 16 illustrated in FIG. 28A and FIG. 28B is provided with the capacitor 3504 which acts to retain the voltage applied to the gate of the current-control TFT 3503. In the embodiment, however, the capacitor 3504 may be omitted.

In the Embodiment 16, the current-control TFT 3503 is NTFT of the invention. Therefore, in the embodiment, the LDD region is so formed that it overlaps with the gate electrode via the gate-insulating film therebetween. In the overlapped region, formed is a parasitic capacitance generally referred to as a gate capacitance. This Embodiment 19 is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the Embodiment 19 illustrated in FIG. 30A, FIG. 30B and FIG. 30C, the capacitor 3805 can be omitted.

The constitution of this Embodiment 19 can be combined with any constitution of Embodiment 1 to 13, 14 to 18 in any desired manner. Incorporating the EL display panel having the pixel structure of this Embodiment 19 into the electronic appliance of Embodiment 10 as its display part is advantageous.

What is claimed is:

1. An active matrix type semiconductor display device, comprising:
   a source signal line driver circuit over a first substrate for supplying an image signal to a plurality of source signal lines;
   a gate signal line driver circuit over said first substrate for supplying a selection signal to a plurality of gate signal lines;
   an active matrix circuit over said first substrate in which pixels each including a pixel TFT and a pixel electrode connected to a drain electrode of said pixel TFT are arranged in matrix form, a source electrode of said pixel TFT is connected to corresponding one of the source signal lines, and a gate electrode of said pixel TFT is connected to corresponding one of said gate signal lines;

two counter electrodes over a second substrate opposed to said first substrate; and a display medium sandwiched between said pixel electrode of each of said pixels and corresponding one of said counter electrodes, wherein said two counter electrodes are respectively disposed correspondingly to pixels of one source signal line at every two source signal lines among said plurality of source signal lines, and wherein the two counter electrodes are respectively applied with a potential opposite to a potential of an image signal supplied to the corresponding source signal line.

2. A device according to claim 1, wherein said display medium comprises a liquid crystal.

3. A device according to claim 1, wherein said display medium comprises an antiferroelectric mixed liquid crystal having V-shaped electrooptical characteristics.

4. A device according to claim 1, wherein said active matrix type semiconductor display device is incorporated in at least one selected from the group consisting of a cellular phone, a video camera, a mobile computer, a goggle-type display, a projector, and a portable electronic book.

5. An active matrix type semiconductor display device, comprising:

a source signal line driver circuit over a first substrate for supplying an image signal to a plurality of source signal lines;

a gate signal line driver circuit over said first substrate for supplying a selection signal to a plurality of gate signal lines;

an active matrix circuit over said first substrate in which pixels each including a pixel TFT and a pixel electrode connected to a drain electrode of said pixel TFT are arranged in matrix form, a source electrode of said pixel TFT is connected to corresponding one of said source signal lines, and a gate electrode of said pixel TFT is connected to corresponding one of said gate signal lines;

two counter electrodes over a second substrate opposed to said first substrate; and a display medium sandwiched between said pixel electrode of each of said pixels and corresponding one of said counter electrodes, wherein said two counter electrodes are respectively disposed correspondingly to pixels of two source signal lines at every four source signal lines among said plurality of source signal lines, and wherein said two counter electrodes are respectively applied with a potential opposite to a potential of an image signal supplied to the corresponding source signal line.

6. A device according to claim 5, wherein said display medium comprises a liquid crystal.

7. A device according to claim 5, wherein said display medium comprises an antiferroelectric mixed liquid crystal having V-shaped electrooptical characteristics.

8. A device according to claim 5, wherein said active matrix type semiconductor display device is incorporated in at least one selected from the group consisting of a cellular phone, a video camera, a mobile computer, a goggle-type display, a projector, and a portable electronic book.

9. An active matrix type semiconductor display device, comprising:

a source signal line driver circuit over a first substrate for supplying an image signal to a plurality of source signal lines;

a gate signal line driver circuit over said first substrate for supplying a selection signal to a plurality of gate signal lines;

an active matrix circuit over said first substrate in which pixels each including a pixel TFT and a pixel electrode connected to a drain electrode of said pixel TFT are arranged in matrix form, a source electrode of said pixel TFT is connected to corresponding one of said source signal lines, and a gate electrode of said pixel TFT is connected to corresponding one of said gate signal lines;

two counter electrodes over a second substrate opposed to said first substrate; and a display medium sandwiched between said pixel electrode of each of said pixels and corresponding one of said counter electrodes, wherein said two counter electrodes are respectively disposed correspondingly to pixels of z source signal lines at every 2z source signal lines among said plurality of source signal lines, and wherein said two counter electrodes are respectively applied with a potential opposite to a potential of an image signal supplied to the corresponding source signal line.

10. A device according to claim 9, wherein said display medium comprises a liquid crystal.

11. A device according to claim 9, wherein said display medium comprises an antiferroelectric mixed liquid crystal having V-shaped electrooptical characteristics.

12. A device according to claim 9, wherein said active matrix type semiconductor display device is incorporated in at least one selected from the group consisting of a cellular phone, a video camera, a mobile computer, a goggle-type display, a projector, and a portable electronic book.

13. An electroluminescence display device comprising:

a pixel portion and a driving circuit portion over a substrate;

at least a first thin film transistor for controlling a current and a second thin film transistor for switching each being formed in the pixel portion;

a source signal line driver circuit provided in said driving circuit portion for supplying an image signal to a plurality of source signal lines;

a gate signal line driver circuit provided in said driving circuit portion for supplying a selection signal to a plurality of gate signal lines;

at least a CMOS transistor being formed in each of said source signal line driver circuit and said gate signal line driver circuit;

a pixel electrode provided in each of pixels and being electrically connected to one of source and drain regions of said first thin film transistor;

a light emitting layer being formed over the pixel electrode; and two counter electrodes each provided over the light emitting layer of the corresponding pixels, wherein said two counter electrodes are respectively disposed correspondingly to pixels of one source signal line at every two source signal lines among said plurality of source signal lines, and wherein the two counter electrodes are respectively applied with a potential opposite to a potential of an image signal supplied to the corresponding source signal line.

14. A device according to claim 13, wherein the light emitting layer is an EL layer.

15. A device according to claim 13, wherein a drain region of the second thin film transistor is electrically connected to the gate electrode of the first thin film transistor.

16. A device according to claim 13, wherein the second thin film transistor has a multi-gate structure.

17. A device according to claim 13, wherein said electroluminescence display device is incorporated in at least one selected from the group consisting of a cellular phone, a video camera, a mobile computer, a goggle-type display, a projector, and a portable electronic book.

18. An electroluminescence display device comprising:
   a pixel portion and a driving circuit portion over a substrate;
   at least a first thin film transistor for controlling a current and a second thin film transistor for switching each being formed in the pixel portion;
   a source signal line driver circuit provided in said driving circuit portion for supplying an image signal to a plurality of source signal lines;
   a gate signal line driver circuit provided in said driving circuit portion for supplying a selection signal to a plurality of gate signal lines;
   at least a CMOS transistor being formed in each of said source signal line driver circuit and said gate signal line driver circuit;
   a pixel electrode provided in each of pixels and being electrically connected to one of source and drain regions of said first thin film transistor;
   a light emitting layer being formed over the pixel electrode; and
   two counter electrodes each provided over the light emitting layer of the corresponding pixels,
   wherein said two counter electrodes are respectively disposed correspondingly to pixels of two source signal lines at every four source signal lines among said plurality of source signal lines, and
   wherein said two counter electrodes are respectively applied with a potential opposite to a potential of an image signal supplied to the corresponding source signal line.

19. A device according to claim 18, wherein the light emitting layer is an EL layer.

20. A device according to claim 18, wherein a drain region of the second thin film transistor is electrically connected to the gate electrode of the first thin film transistor.

21. A device according to claim 18, wherein the second thin film transistor has a multi-gate structure.

22. A device according to claim 18, wherein said electroluminescence display device is incorporated in at least one selected from the group consisting of a cellular phone, a video camera, a mobile computer, a goggle-type display, a projector, and a portable electronic book.

23. An electroluminescence display device comprising:
   a pixel portion and a driving circuit portion over a substrate;
   at least a first thin film transistor for controlling a current and a second thin film transistor for switching each being formed in the pixel portion;
   a source signal line driver circuit provided in said driving circuit portion for supplying an image signal to a plurality of source signal lines;
   a gate signal line driver circuit provided in said driving circuit portion for supplying a selection signal to a plurality of gate signal lines;
   at least a CMOS transistor being formed in each of said source signal line driver circuit and said gate signal line driver circuit;
   a pixel electrode provided in each of pixels and being electrically connected to one of source and drain regions of said first thin film transistor;
   a light emitting layer being formed over the pixel electrode; and
   two counter electrodes each provided over the light emitting layer of the corresponding pixels,
   wherein said two counter electrodes are respectively disposed correspondingly to pixels of z source signal lines at every 2z source signal lines among said plurality of source signal lines, and
   wherein said two counter electrodes are respectively applied with a potential opposite to a potential of an image signal supplied to the corresponding source signal line.

24. A device according to claim 23, wherein the light emitting layer is an EL layer.

25. A device according to claim 23, wherein a drain region of the second thin film transistor is electrically connected to the gate electrode of the first thin film transistor.

26. A device according to claim 23, wherein the second thin film transistor has a multi-gate structure.

27. A device according to claim 23, wherein said electroluminescence display device is incorporated in at least one selected from the group consisting of a cellular phone, a video camera, a mobile computer, a goggle-type display, a projector, and a portable.

* * * * *